United States Patent
Cannan et al.

(10) Patent No.: US 10,975,295 B2
(45) Date of Patent: *Apr. 13, 2021

(54) PROPPANT HAVING NON-UNIFORM ELECTRICALLY CONDUCTIVE COATINGS AND METHODS FOR MAKING AND USING SAME

(71) Applicant: CARBO CERAMICS INC., Houston, TX (US)

(72) Inventors: Chad Cannan, Houston, TX (US); Lewis Bartel, Albuquerque, NM (US); Todd Roper, Katy, TX (US)

(73) Assignee: CARBO CERAMICS, INC., Houston, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/167,353

(22) Filed: Oct. 22, 2018

(65) Prior Publication Data

US 2019/0048254 A1    Feb. 14, 2019

Related U.S. Application Data

(63) Continuation of application No. 15/130,732, filed on Apr. 15, 2016, now Pat. No. 10,106,732, which is a (Continued)

(51) Int. Cl.
*B32B 5/16* (2006.01)
*C09K 8/80* (2006.01)
(Continued)

(52) U.S. Cl.
CPC .......... *C09K 8/805* (2013.01); *C23C 18/1639* (2013.01); *C23C 18/32* (2013.01);
(Continued)

(58) Field of Classification Search
CPC ....................................... C09K 8/805
(Continued)

(56) References Cited

U.S. PATENT DOCUMENTS

| 7,073,581 B2 | 7/2006 | Nguyen et al. |
| 9,434,875 B1* | 9/2016 | Cannan .................. C09K 8/805 |

(Continued)

FOREIGN PATENT DOCUMENTS

| CN | 102099545 | 6/2011 |
| WO | 2014/066144 A1 | 5/2014 |
| WO | 2014/093229 A1 | 6/2014 |

OTHER PUBLICATIONS

Chinese Office Action dated Dec. 25, 2019 for Application No. 201680035494.4.

(Continued)

*Primary Examiner* — Hoa (Holly) Le
(74) *Attorney, Agent, or Firm* — Patterson + Sheridan, LLP

(57) ABSTRACT

Electrically conductive proppant particles having non-uniform electrically conductive coatings are disclosed. The non-uniform electrically conductive coatings can have a thickness of at least about 10 nm formed on an outer surface of a sintered, substantially round and spherical particle, wherein less than 95% of the outer surface of the sintered, substantially round and spherical particle is coated with the electrically conductive material. Methods for making and using such electrically conductive proppant particles having non-uniform electrically conductive coatings are also disclosed.

20 Claims, 18 Drawing Sheets

Related U.S. Application Data continuation-in-part of application No. 14/826,965, filed on Aug. 14, 2015, now Pat. No. 10,301,536, and a continuation-in-part of application No. 14/942,304, filed on Nov. 16, 2015, now Pat. No. 10,267,134, which is a continuation-in-part of application No. 14/629,004, filed on Feb. 23, 2015, now abandoned, which is a continuation-in-part of application No. 14/593,447, filed on Jan. 9, 2015, now Pat. No. 10,538,695, which is a continuation of application No. 14/147,372, filed on Jan. 3, 2014, now Pat. No. 8,931,553, and a continuation of application No. PCT/US2014/010228, filed on Jan. 3, 2014, said application No. 14/826,965 is a continuation-in-part of application No. 14/572,486, filed on Dec. 16, 2014, now Pat. No. 9,434,875.

(60) Provisional application No. 61/749,093, filed on Jan. 4, 2013, provisional application No. 62/148,422, filed on Apr. 16, 2015.

(51) Int. Cl.

| | |
|---|---|
| *E21B 43/267* | (2006.01) |
| *G01V 3/26* | (2006.01) |
| *G01R 33/12* | (2006.01) |
| *C23C 18/16* | (2006.01) |
| *C23C 18/32* | (2006.01) |
| *C23C 18/38* | (2006.01) |
| *C23C 18/50* | (2006.01) |
| *E21B 47/092* | (2012.01) |
| *C23C 18/18* | (2006.01) |

(52) U.S. Cl.
CPC .............. *C23C 18/38* (2013.01); *C23C 18/50* (2013.01); *E21B 43/267* (2013.01); *E21B 47/092* (2020.05); *G01R 33/1276* (2013.01); *G01V 3/26* (2013.01); *C23C 18/1893* (2013.01)

(58) Field of Classification Search
USPC .................................................. 428/403–407
See application file for complete search history.

(56) References Cited

U.S. PATENT DOCUMENTS

| | | | |
|---|---|---|---|
| 9,803,135 B2 | 10/2017 | Barron et al. | |
| 9,810,804 B2 | 11/2017 | Kalish | |
| 10,012,752 B2 | 7/2018 | Hibbs et al. | |
| 10,035,950 B2* | 7/2018 | Lehman | C09K 8/68 |
| 10,106,732 B2* | 10/2018 | Cannan | C09K 8/805 |
| 10,132,952 B2 | 11/2018 | Marsala et al. | |
| 2005/0274510 A1* | 12/2005 | Nguyen | E21B 43/267 |
| | | | 166/250.12 |
| 2009/0107673 A1 | 4/2009 | Huang et al. | |
| 2011/0272146 A1 | 11/2011 | Green et al. | |
| 2012/0325458 A1* | 12/2012 | El-Rabaa | E21B 43/267 |
| | | | 166/248 |
| 2014/0190686 A1 | 7/2014 | Cannan et al. | |
| 2014/0338898 A1* | 11/2014 | Allison | E21B 43/267 |
| | | | 166/254.1 |
| 2014/0374091 A1 | 12/2014 | Wilt et al. | |
| 2015/0276969 A1 | 10/2015 | Donderici et al. | |
| 2016/0040514 A1 | 2/2016 | Rahmani et al. | |
| 2016/0186050 A1* | 6/2016 | Lehman | C09K 8/80 |
| | | | 166/280.2 |
| 2016/0222283 A1* | 8/2016 | Cannan | C09K 8/805 |
| 2016/0237342 A1* | 8/2016 | Cannan | C09K 8/805 |
| 2016/0281498 A1 | 9/2016 | Nguyen et al. | |
| 2016/0282502 A1 | 9/2016 | Sharma et al. | |
| 2019/0225877 A1* | 7/2019 | Roper | C09K 8/805 |

OTHER PUBLICATIONS

International Search Report and Written Opinion dated Jul. 18, 2016 for Application No. PCT/US2016/027917.

Non-Final Office Action dated Oct. 6, 2017 for U.S. Appl. No. 15/130,732.

\* cited by examiner

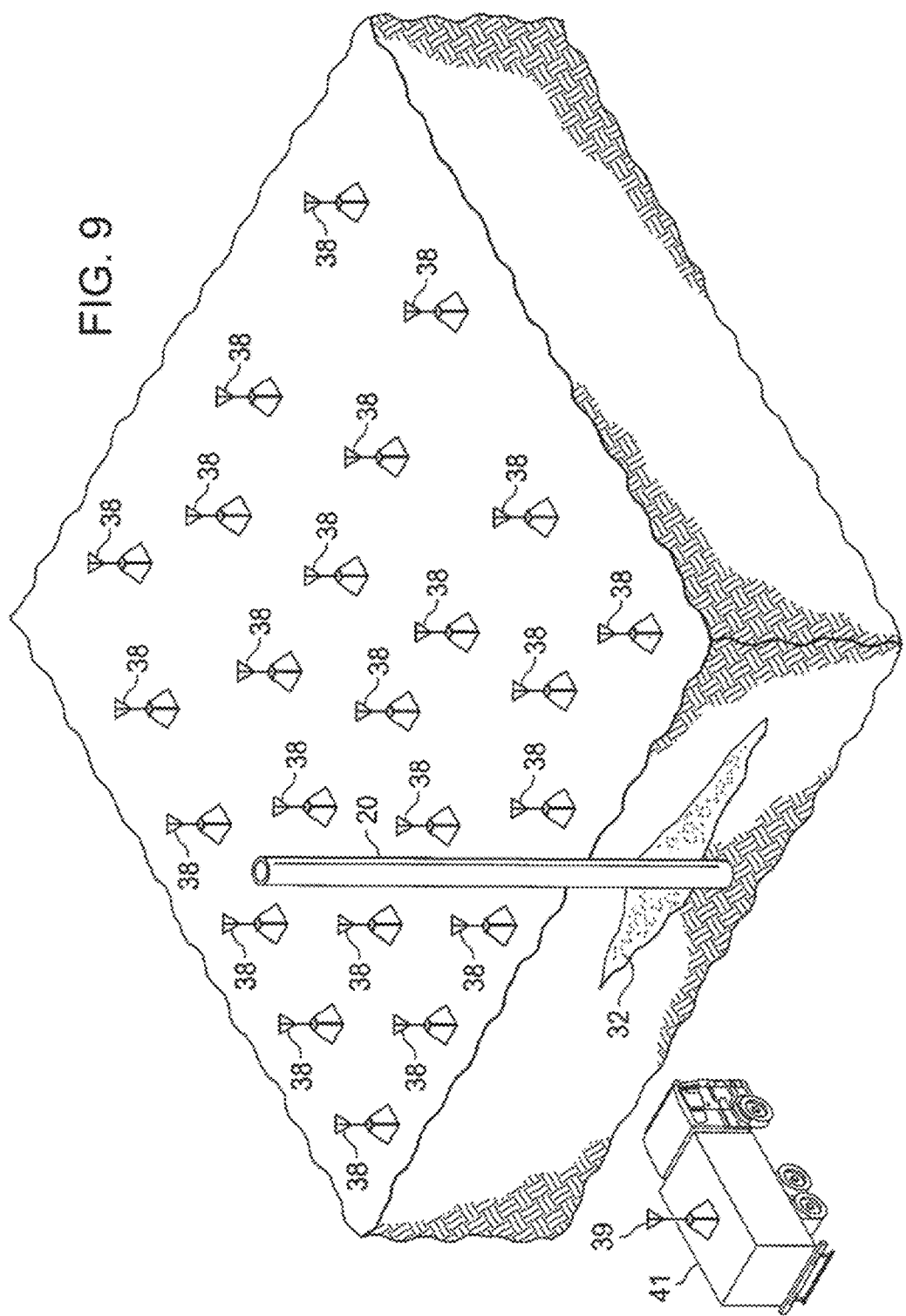

PROPPANT HAVING NON-UNIFORM ELECTRICALLY CONDUCTIVE COATINGS AND METHODS FOR MAKING AND USING SAME

CROSS-REFERENCE TO RELATED PATENT APPLICATIONS

This application is a continuation of U.S. patent application Ser. No. 15/130,732, filed Apr. 15, 2016, which is a continuation-in-part of U.S. patent application Ser. No. 14/826,965 filed on Aug. 14, 2015, which is a continuation in part of U.S. patent application Ser. No. 14/572,486 filed on Dec. 16, 2014, U.S. patent application Ser. No. 15/130,732, filed Apr. 15, 2016 is also a continuation-in-part of U.S. patent application Ser. No. 14/942,304 field on Nov. 16, 2015, which is a continuation-in-part of U.S. patent application Ser. No. 14/629,004 filed on Feb. 23, 2015, which is a continuation-in-part of U.S. patent application Ser. No. 14/593,447 filed on Jan. 9, 2015, which is a continuation of U.S. patent application Ser. No. 14/147,372, now U.S. Pat. No. 8,931,553, filed on Jan. 3, 2014 and International Patent Application No. PCT/US2014/010228 filed Jan. 3, 2014, each of these prior applications being incorporated herein by reference in its entirety. U.S. patent application Ser. No. 14/942,304, U.S. patent application Ser. No. 14/629,004, U.S. patent application Ser. No. 14/593,447, U.S. patent application Ser. No. 14/147,372, and International Patent Application No. PCT/US2014/010228 each claims the benefit of U.S. Provisional Patent Application No. 61/749,093 filed Jan. 4, 2013 which is incorporated herein by reference in its entirety. U.S. patent application Ser. No. 15/130,732, filed Apr. 15, 2016 also claims the benefit of U.S. Provisional Patent Application No. 62/148,422 filed Apr. 16, 2015 which is incorporated herein by reference in its entirety.

FIELD

Embodiments of the present invention relate generally to hydraulic fracturing of geological formations, and more particularly to electrically conductive proppants used in the hydraulic fracture stimulation of gas, oil, or geothermal reservoirs. Embodiments of the present invention relate to compositions and methods for the formation of the electrically conductive proppants for use in the electromagnetic methods for detecting, locating and characterizing such proppants.

BACKGROUND

In order to stimulate and more effectively produce hydrocarbons from downhole formations, especially formations with low porosity and/or low permeability, induced fracturing (called "frac operations", "hydraulic fracturing", or simply "Tracing") of the hydrocarbon-bearing formations has been a commonly used technique. In a typical frac operation, fluids are pumped downhole under high pressure, causing the formations to fracture around the borehole, creating high permeability conduits that promote the flow of the hydrocarbons into the borehole. These frac operations can be conducted in horizontal and deviated, as well as vertical, boreholes, and in either intervals of uncased wells, or in cased wells through perforations.

In cased boreholes in vertical wells, for example, the high pressure fluids exit the borehole via perforations through the casing and surrounding cement, and cause the formations to fracture, usually in thin, generally vertical sheet-like fractures in the deeper formations in which oil and gas are commonly found. These induced fractures generally extend laterally a considerable distance out from the wellbore into the surrounding formations, and extend vertically until the fracture reaches a formation that is not easily fractured above and/or below the desired frac interval. The directions of maximum and minimum horizontal stress within the formation determine the azimuthal orientation of the induced fractures. Normally, if the fluid, sometimes called slurry, pumped downhole does not contain solids that remain lodged in the fracture when the fluid pressure is relaxed, then the fracture re-closes, and most of the permeability conduit gain is lost.

These solids, called proppants, are generally composed of sand grains or ceramic particles, and the fluid used to pump these solids downhole is usually designed to be sufficiently viscous such that the proppant particles remain entrained in the fluid as it moves downhole and out into the induced fractures. Prior to producing the fractured formations, materials called "breakers", which are also pumped downhole in the frac fluid slurry, reduce the viscosity of the frac fluid after a desired time delay, enabling these fluids to be easily removed from the fractures during production, leaving the proppant particles in place in the induced fractures to keep them from closing and thereby substantially precluding production fluid flow there through.

The proppants may also be placed in the induced fractures with a low viscosity fluid in fracturing operations referred to as "water fracs" or "slick water fracs". The fracturing fluid in water fracs is water with little or no polymer or other additives. Water fracs are advantageous because of the lower cost of the fluid used. Also when using cross-linked polymers, it is essential that the breakers be effective or the fluid cannot be recovered from the fracture, effectively restricting flow of formation fluids. Water fracs, because the fluid is not cross-linked, do not rely on the effectiveness of breakers.

Commonly used proppants include naturally occurring sands, resin coated sands, and ceramic proppants. Ceramic proppants are typically manufactured from naturally occurring materials such as kaolin and bauxitic clays, and offer a number of advantages compared to sands or resin coated sands principally resulting from the compressive strength of the manufactured ceramics and their highly spherical particle shape.

Although induced fracturing has been a highly effective tool in the production of hydrocarbon reservoirs, the amount of stimulation provided by this process depends to a large extent upon the ability to generate new fractures, or to create or extend existing fractures, as well as the ability to maintain connection to the fractures through appropriate placement of the proppant. Without appropriate placement of the proppant, fractures generated during the hydraulic fracturing may tend to close, thereby diminishing the benefits of the hydraulic fracturing treatment. However, reliable methods for detecting, locating and characterizing the placement of proppant within fractures at relatively far distances from the wellbore and thus confirming whether or not such placement has been appropriate are not available.

Current state of the art proppant identification techniques are limited to relatively short distances (12 inches to 18 inches maximum) from the wellbore. Radioactive and non-radioactive tracers and proppants are currently used to infer the presence of proppant in the near well bore region. A better understanding of proppant placement in the far field regions of a hydraulic fracture is needed.

Previous work for massive hydraulic fracture mapping is summarized in Bartel, L. C., McCann, R. P., and Keck, L. J., Use of potential gradients in massive hydraulic fracture mapping and characterization, prepared for the 51st Annual Fall Technical Conference and Exhibition of Society of Petroleum Engineers, New Orleans, Oct. 3-6, 1976 paper SPE 6090. In this previous work, the electric potential differences were measured between two concentric circles of voltage electrodes around a vertical fracture well at the earth's surface. The well was electrically energized at the top of the well casing or at the depth of the fracture. The electrical ground was established at a well located at a distance of approximately one mile from the fracture well. At that time, the fact that the grounding wire acted as a transmitting antenna was not taken into account. The water used for the fracture process contained potassium chloride (KCl) to enhance its electrical conductivity and the fracture was propped using non-conducting sand. A 1 Hz repetition rate square wave input current waveform was used and only the voltage difference amplitudes were measured. Voltages using an elementary theory based on current leakage from the well casing and the fracture into a homogeneous earth were used to produce expected responses. Comparing the field data to results from the elementary model showed that a fracture orientation could be inferred, however, since the model did not account for the details of the fracture, other fracture properties could not be determined using the elementary model.

Electrically conductive proppant has been used to determine a proppant pack location within one or more fracture(s). For example, U.S. Pat. No. 8,931,553 discloses providing proppant particles having a substantially uniform coating of electrically conductive material of at least 500 nm in thickness for detection, location and characterization of the proppant particles in one or more fractures via electromagnetic (EM) methods. However, coating proppant particles with a substantially uniform coating of electrically conductive material can be cost prohibitive.

There is a need, therefore, for a method of detecting, locating and characterizing the location of the proppant as placed in a hydraulic fracture at distances of more than several inches from the cased wellbore in a manner that is not cost prohibitive.

BRIEF DESCRIPTION OF THE DRAWINGS

The invention may best be understood by referring to the following description and accompanying drawings that are used to illustrate embodiments of the invention. In the drawings:

FIG. 9 is a schematic perspective illustration of a hydraulic fracture mapping system.

DETAILED DESCRIPTION

In the following description, numerous specific details are set forth. However, it is understood that embodiments of the invention may be practiced without these specific details. In other instances, well-known structures and techniques have not been shown in detail in order not to obscure the understanding of this description.

Described herein are electrically conductive sintered, substantially round and spherical particles and methods for preparing such electrically conductive sintered, substantially round and spherical particles, referred to hereinafter as "electrically conductive proppant," from a slurry of an alumina containing raw material for use as proppants detectable by electromagnetic (EM) methods. In particular, electrically conductive proppant having irregular, or non-uniform, coatings of electrically conductive material on its outer surfaces are described herein. Also described herein are electrically conductive proppant packs having an electrically conductive portion and a non-electrically conductive portion. The electrically conductive portion can include electrically conductive proppant having uniform or non-uniform coatings of electrically conductive material on its outer surfaces. The term "substantially round and spherical" and related forms, as used herein, is defined to mean an average ratio of minimum diameter to maximum diameter of about 0.8 or greater, or having an average sphericity value of about 0.8 or greater compared to a Krumbein and Sloss chart. Also described herein are electromagnetic methods for detecting, locating, and characterizing the electrically conductive proppants used in the hydraulic fracture stimulation of gas, oil, or geothermal reservoirs.

Figure 1:
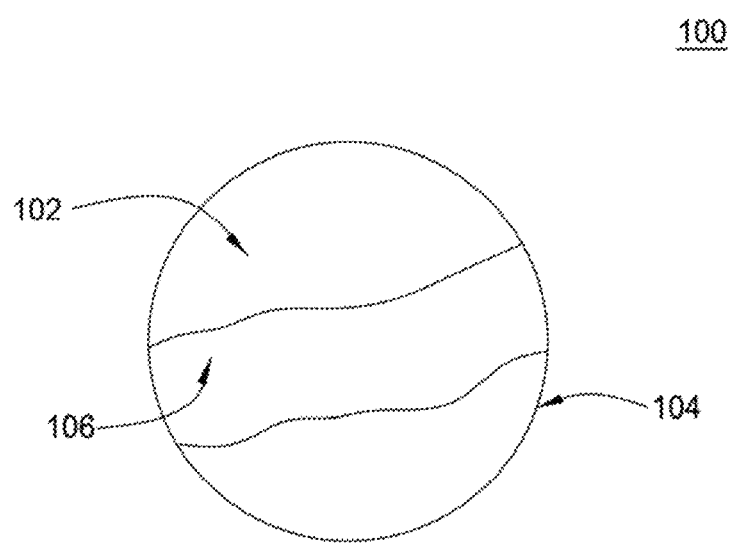
FIG. 1 depicts a perspective view an illustrative proppant particle have a non-uniform coating of electrically conductive material.

The electrically conductive proppant can include an irregular or non-uniform coating of electrically conductive material. FIG. 1 depicts an illustrative electrically conductive proppant particle 100 having a non-uniform coating of an electrically conductive material 106. As shown in FIG. 1, a proppant particle 102 such as sand or ceramic proppant can be partially coated with the electrically conductive material 106 to provide the electrically conductive proppant particle 100. The coating of electrically conductive material 106 can cover or coat any suitable portion of the surface 104 of the proppant particle 102. In one or more exemplary embodiments, the coating of electrically conductive material 106 can cover at least about 10%, at least about 15%, at least about 20%, at least about 30%, at least about 40%, or at least about 50% of the surface 104 of the electrically conductive proppant particle 100. In one or more exemplary embodiments, the coating of electrically conductive material 106 can cover less than 100%, less than 99%, less than 95%, less than 90%, less than 85%, less than 80%, less than 75%, less than 65%, less than 50%, less than 40%, or less than 35% of the surface 104 of the electrically conductive proppant particle 100. In one or more exemplary embodiments, about 25%, about 30%, about 35%, or about 45% to about 55%, about 65%, about 75%, about 85%, about 90%, about 95%, or about 99% or more of the surface 104 of the electrically conductive proppant particle 100 can be covered by the electrically conductive material 106. For example, the coating of electrically conductive material 106 can cover from about 10% to about 99%, from about 15% to about 95%, from about 20% to about 75%, from about 25% to about 65%, from about 30% to about 45%, from about 35% to about 75%, from about 45% to about 90%, or from about 40% to about 95% of the surface 104 of the electrically conductive proppant particle 100.

The coating of electrically conductive material 106 can have any suitable thickness. In one or more exemplary embodiments, the coating of electrically conductive material 106 can have an average thickness ranging from about 5 nm, about 10 nm, about 25 nm, about 50 nm, about 100 nm, or about 200 nm to about 300 nm, about 400 nm, about 500 nm, about 750 nm, about 1,000 about 1,500 nm, about 2,000 nm, or about 5,000 nm. For example, the average thickness of the coating of electrically conductive material 106 can be from about 400 nm to about 1,000 nm, from about 200 nm to about 600 nm, or from about 100 nm to about 400 nm. The coating of electrically conductive material 106 can also have any suitable variation in thickness. In one or more exemplary embodiments, the thickness of the coating of electrically conductive material 106 can vary from about 10 nm to about 1,000 nm, from about 50 nm to about 500 nm, from about 100 nm to about 400 nm, or from about 400 nm to about 1,000 nm.

Figure 2:
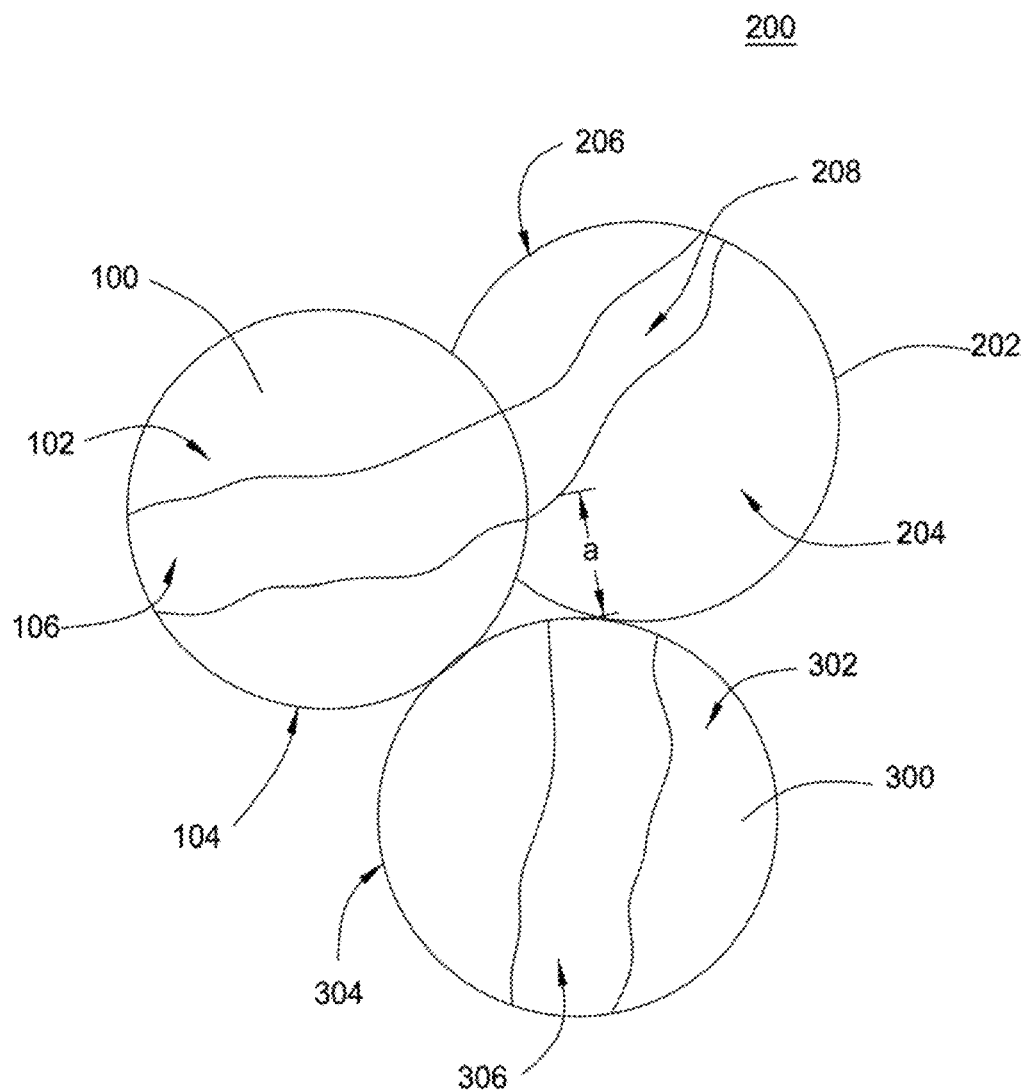
FIG. 2 depicts a perspective view of an illustrative electrically conductive proppant pack 200 containing the proppant particle of FIG. 1 in contact with two other proppant particles having non-uniform coatings of electrically conductive material.

Two or more electrically conductive proppant each having the irregular or non-uniform coating of electrically conductive material can be in contact with one another to form an electrically conductive proppant pack. FIG. 2 depicts a perspective view of an illustrative electrically conductive proppant pack 200 containing the electrically conductive proppant particle 100, or first electrically conductive proppant particle 100, in contact with second and third electrically conductive proppant particles 202, 300 having second and third non-uniform coatings of electrically conductive material 208, 306, respectively. Similar to the first electrically conductive proppant particle 100, the second and third electrically conductive proppant particles 202, 300 can include second and third proppant particles 204, 302 such as sand or ceramic proppant partially coated with the second and third electrically conductive materials 208, 306, respectively. The coatings of the second and third electrically conductive materials 208, 306 can cover or coat any suitable portion of the second and third surfaces 206, 304 of the proppant particles 204, 302, respectively. In one or more exemplary embodiments, the coatings of electrically conductive materials 208, 306 can cover at least 1%, at least 5%, at least 10%, at least 15%, at least 20%, at least 30%, at least 40%, or at least 50% of the respective surfaces 206, 304 of the second and third electrically conductive proppant particles 202, 300. In one or more exemplary embodiments, the coatings of electrically conductive material 208, 306 can cover less than 100%, less than 99%, less than 95%, less than 90%, less than 85%, less than 80%, less than 75%, less than 65%, less than 50%, less than 40%, less than 25%, less than 20%, or less than 10% of the surfaces 206, 304 of the electrically conductive proppant particles 202, 300. In one or more exemplary embodiments, about 1%, about 4%, about 8%, about 12%, about 18%, about 25%, about 35%, or about 45% to about 55%, about 65%, about 75%, about 85%, about 90%, about 95%, or about 99% or more of the surfaces 206, 304 of the electrically conductive proppant particles 202, 300 can be covered by the electrically conductive materials 208, 306. For example, the coatings of conductive materials 208, 306 can cover from about 1% to about 99%, from about 5% to about 95%, from about 10% to about 75%, from about 15% to about 65%, from about 25% to about 45%, from about 35% to about 75%, from about 45% to about 90%, or from about 40% to about 95% of the surfaces 206, 304 of the electrically conductive proppant particles 202, 300.

The coatings of second and third electrically conductive materials 208, 306 can have any suitable thickness. In one or more exemplary embodiments, the coatings of second and third electrically conductive materials 208, 306 can have an average thickness ranging from about 5 nm, about 10 nm, about 25 nm, about 50 nm, about 100 nm, or about 200 nm to about 300 nm, about 400 nm, about 500 nm, about 750 nm, about 1,000 about 1,500 nm, about 2,000 nm, or about 5,000 nm. For example, the average thickness of the coatings of second and third electrically conductive materials 208, 306 can be from about 400 nm to about 1,000 nm, from about 200 nm to about 600 nm, or from about 100 nm to about 400 nm. The coatings of second and third electrically conductive materials 208, 306 can also have any suitable variation in thickness. In one or more exemplary embodiments, the thickness of the coatings of second and third electrically conductive materials 208, 306 can vary from about 10 nm to about 1,000 nm, from about 50 nm to about 500 nm, from about 100 nm to about 400 nm, or from about 400 nm to about 1,000 nm.

As shown in FIG. 2, the coating of electrically conductive material 106 of particle 100 can be in direct contact with coating of electrically conductive material 208 of the adjacently disposed particle 202. The direct contact of the electrically conductive material 106 with the electrically conductive material 208 can form a conductive bridge or link so that the electrically conductive material 106 is electrically coupled to the electrically conductive material 208. This conductive bridge can be imperfect, meaning there can be some contact resistance in the conductive bridge that can lead to charge build up at the interfaces of the particles. When the energizing field is turned off, these charges will flow back to their equilibrium state, which does not occur instantaneously. This charge redistribution leads to the induced polarization effect discussed below in greater detail. The conductive bridge can allow an electric and/or magnetic field or charge to move across the electrically conductive proppant pack 200, from the first electrically conductive proppant particle 100 to the second electrically conductive proppant particle 202.

Also shown in FIG. 2 is a gap D that can be present between the second electrically conductive material 208 and the third electrically conductive material 306 in the proppant pack 200. The gap D can have any length suitable to permit the electric and/or magnetic field or charge to move from the second electrically conductive proppant particle 202 to the third electrically conductive proppant particle 300 via the gap D. Even though the second electrically conductive material 208 is not in direct physical contact with the third electrically conductive material 306, the charges on materials 106 and 208 will induce charges onto the material 306. In other words, even though the metallic coating 306 is not directly contacting the metallic coatings 106 and/or 208, an energizing electric field will cause charge separation in the 306 coating thereby influencing flow in coatings 106 and 208. For a time-dependent source field, coating 306 will capacitively couple to coatings 106 and 208 resulting in a displacement current that can flow between particles that are not in direct physical contact with each other, such as coatings 306 and 106 and/or 208. In one or more exemplary embodiments, the gap D can be from about 1 micron, about 5 microns, about 25 microns, about 50 microns, about 100 microns, or about 250 microns to about 300 microns, about 400 microns, about 500 microns, about 750 microns, or about 1,000 microns or more.

The electrically conductive proppant pack 200 can have any suitable electrical conductivity. In one or more exemplary embodiments, the electrically conductive proppant pack 200 can have an electrical conductivity of at least about 1 Siemen-meter (Siemen-m), at least about 5 Siemen-m, at least about 15 Siemen-m, at least about 50 Siemen-m, at least about 100 Siemen-m, at least about 250 Siemen-m, at leak about 500 Siemen-m, at least about 750 Siemen-in, at least about 1,000 Siemen-m, at least about 1,500 Siemen-m, or at least about 2,000 Siemen-m. The electrical conductivity of the pack 200 can also be from about 10 Siemen-m, about 50 Siemen-m, about 100 Siemen-m, about 500 Siemen-m, about 1,000 Siemen-m, or about 1,500 Siemen-m to about 2,000 Siemen-m, about 3,00 Siemen-m, about 4,000 Siemen-m, about 5,000 Siemen-m, or about 6,000 Siemen-m. The electrically conductive proppant pack 200 can have any suitable resistivity. In one or more exemplary embodiments, the pack 200 can have a resistivity of less than 100 Ohm-cm, less than 80 Ohm-cm, less than 50 Ohm-cm, less than 25 Ohm-cm, less than 15 Ohm-cm, less than 5 Ohm-cm, less than 2 Ohm-cm, less than 1 Ohm-cm, less than 0.5 Ohm-cm, or less than 0.1 Ohm-cm.

In one or more exemplary embodiments, increasing a load or pressure onto the pack of the electrically conductive proppant pack 200 by a factor of 2, a factor of 5, or a factor of 10 can increase the electrical conductivity of the pack of the electrically conductive proppant pack 200 by at least about 50%, at least about 75%, at least about 100%, at least about 150%, or at least about 200%. In one or more exemplary embodiments, increasing a load or pressure onto the pack of the electrically conductive proppant pack 200 by a factor of 2, a factor of 5, or a factor of 10 can decrease the resistivity of the pack of the electrically conductive proppant pack 200 by, from about 1%, about 2%, or about 5% to about 10%, about 15%, or about 25%.

According to embodiments of the present invention, the electrically conductive proppant can be made from a conventional proppant such as a ceramic proppant, sand, plastic beads and glass beads. Such conventional proppants can be manufactured according to any suitable process including, but not limited to continuous spray atomization, spray fluidization, spray drying, or compression. Suitable conventional proppants and methods for their manufacture are disclosed in U.S. Pat. Nos. 4,068,718, 4,427,068, 4,440,866, 5,188,175, and 7,036,591, the entire disclosures of which are incorporated herein by reference.

Ceramic proppants vary in properties such as apparent specific gravity by virtue of the starting raw material and the manufacturing process. The term "apparent specific gravity" as used herein is the weight per unit volume (grams per cubic centimeter) of the particles, including the internal porosity. Low density proppants generally have an apparent specific gravity of less than 3.0 g/cm$^3$ and are typically made from kaolin clay and other alumina, oxide, or silicate ceramics. Intermediate density proppants generally have an apparent specific gravity of about 3.1 to 3.4 g/cm$^3$ and are typically made from bauxitic clay. High strength proppants are generally made from bauxitic clays with alumina and have an apparent specific gravity above 3.4 g/cm$^3$.

As described herein, sintered, substantially round and spherical particles, or proppants, are prepared from a slurry of alumina-containing raw material. In certain embodiments, the particles have an alumina content of from about 40% to about 55% by weight. In certain other embodiments, the sintered, substantially round and spherical particles have an alumina content of from about 41.5% to about 49% by weight.

In certain embodiments, the proppants have a bulk density of from about 1.35 g/cm$^3$ to about 1.55 g/cm$^3$. The term "bulk density", as used herein, refers to the weight per unit volume, including in the volume considered, the void spaces between the particles. In certain other embodiments, the proppants have a bulk density of from about 1.40 g/cm$^3$ to about 1.50 g/cm$^3$.

According to several exemplary embodiments, the proppants have any suitable permeability and fluid conductivity in accordance with ISO 13503-5: "Procedures for Measuring the Long-term Conductivity of Proppants," and expressed in terms of Darcy units, or Darcies (D). The proppants can have a long term permeability at 7,500 psi of at least about 1 D, at least about 2 D, at least about 5 D, at least about 10 D, at least about 20 D, at least about 40 D, at least about 80 D, at least about 120 D, or at least about 150 D. The proppants can have a long term permeability at 12,000 psi of at least about 1 D, at least about 2 D, at least about 3 D, at least about 4 D, at least about 5 D, at least about 10 D, at least about 25 D, or at least about 50 D. The proppants can have a long term conductivity at 7,500 psi of at least about 100 millidarcy-feet (mD-ft), at least about 200 mD-ft, at least about 300 mD-ft, at least about 500 mD-ft, at least about 1,000 mD-ft, at least about 1,500 mD-ft, at least about 2,000 mD-ft, or at least about 2,500 mD-ft. For example, the proppants can have a long term conductivity at 12,000 psi of at least about 50 mD-ft, at least about 100 mD-ft, at least about 200 mD-ft, at least about 300 mD-ft, at least about 500 mD-ft, at least about 1,000 mD-ft, or at least about 1.500 mD-ft.

In certain embodiments, the proppants have a crush strength at 10,000 psi of from about 5% to about 8.5%, and a long term fluid conductivity at 10,000 psi of from about 2500 mD-ft to about 3000 mD-ft. In certain other embodiments, the proppants have a crush strength at 10,000 psi of from about 5% to about 7.5%.

The proppants can have any suitable apparent specific gravity. In one or more exemplary embodiments, the proppants have an apparent specific gravity of less than 5, less than 4.5, less than 4.2, less than 4, less than 3.8, less than 3.5, or less than 3.2. In still other embodiments, the proppants have an apparent specific gravity of from about 2.50 to about 3.00, about 2.75 to about 3.25, about 2.8 to about 3.4, about 3.0 to about 3.5, or about 3.2 to about 3.8. In one or more exemplary embodiments, the proppants can have a specific gravity of about 5 or less, about 4.5 or less, about 4.2 or less, about 4 or less, or about 3.8 or less. The term "apparent specific gravity," (ASG) as used herein, refers to a number without units that is defined to be numerically equal to the weight in grains per cubic centimeter of volume, including void space or open porosity in determining the volume.

In one or more exemplary embodiments, the ceramic proppant can be manufactured in a manner that creates porosity in the proppant grain. A process to manufacture a suitable porous ceramic proppant is described in U.S. Pat. No. 7,036,591, the entire disclosure of which is incorporated herein by reference. In this case the electrically conductive material can be impregnated into the pores of the proppant grains to a concentration of about 0.01 wt %, about 0.05 wt %, about 0.1 wt %, about 0.5 wt %, about 1 wt %, about 2 wt %, or about 5 wt % to about 6 wt %, about 8 wt %, about 10 wt %, about 12 wt %, about 15 wt %, or about 20 wt % based on the weight of the electrically conductive proppant. Water soluble coatings such as polylactic acid can be used to coat these particles to allow for delayed/timed release of conductive particles.

The ceramic proppants can have any suitable porosity. The ceramic proppants can include an internal interconnected porosity from about 1%, about 2%, about 4%, about 6%, about 8%, about 10%, about 12%, or about 14% to about 18%, about 20%, about 22%, about 24%, about 26%, about 28%, about 30%, about 34%, about 38%, or about 45% or more. In several exemplary embodiments, the internal interconnected porosity of the ceramic proppants is from about 5 to about 35%, about 5 to about 15%, or about 15 to about 35%. According to several exemplary embodiments, the ceramic proppants have any suitable average pore size. For example, the ceramic proppant can have an average pore size from about 2 nm, about 10 nm, about 15 nm, about 55 nm, about 110 nm, about 520 nm, or about 1,100 nm to about 2,200 nm, about 5,500 nm, about 11,000 nm, about 17,000 nm, or about 25,000 nm or more in its largest dimension. For example, the ceramic proppant can have an average pore size from about 3 nm to about 30,000 nm, about 30 nm to about 18,000 nm, about 200 nm to about 9,000 nm, about 350 nm to about 4,500 nm, or about 850 nm to about 1,800 nm in its largest dimension.

Suitable sintered, substantially round and spherical particles can also include proppants manufactured according to vibration-induced dripping methods, herein called "drip casting." Suitable drip casting methods and proppants made therefrom are disclosed in U.S. Pat. Nos. 8,865,631, 8,883, 693 and 9,175,210, U.S. Patent Application Publication Nos. US 2015/0166880 and US 2016/0017214, and U.S. patent application Ser. No. 15/066,936, the entire disclosures of which are incorporated herein by reference. Proppants produced from the drip cast methods can have a specific gravity of at least about 2.5, at least about 2.7, at least about 3, at least about 3.3, or at least about 3.5. Proppants produced from the drip cast methods can have a specific gravity of about 5 or less, about 4.5 or less, or about 4 or less. The drip cast proppants can also have a surface roughness of less than 5 µm, less than 4 µm, less than 3 µm, less than 2.5 µm, less than 2 µm, less than 1.5 µm, or less than 1 µm. In one or more exemplary embodiments, the drip cast proppants have an average largest pore size of less than about 25 µm, less than about 20 µm, less than about 18 µm, less than about 16 µm, less than about 14 µm, or less than about 12 µm and/or a standard deviation in pore size of less than 6 µm, less than 4 µm, less than 3 µm, less than 2.5 µm, less than 2 pin, less than 1.5 µm, or less than 1 µm. In one or more exemplary embodiments, the drip cast proppants have less than 5,000, less than 4,500, less than 4,000, less than 3,500, less than 3,000, less than 2,500, or less than 2,200 visible pores at a magnification of 500× per square millimeter of proppant particle.

The proppants, produced by the drip casting methods or the conventional methods, can have any suitable composition. The proppants can be or include silica and/or alumina in any suitable amounts. According to one or more embodiments, the proppants include less than 80 wt %, less than 60 wt %, less than 40 wt %, less than 30 wt %, less than 20 wt %, less than 10 wt %, or less than 5 wt % silica based on the total weight of the proppants. According to one or more embodiments, the proppants include from about 0.1 wt % to about 70 wt % silica, from about 1 wt % to about 60 wt % silica, from about 2.5 wt % to about 50 wt % silica, from about 5 wt % to about 40 wt % silica, or from about 10 wt % to about 30 wt % silica. According to one or more embodiments, the proppants include at least about 30 wt %, at least about 50 wt %, at least about 60 wt %, at least about 70 wt %, at least about 80 wt %, at least about 90 w %, or at least about 95 wt % alumina based on the total weight of the proppants. According to one or more embodiments, the proppants include from about 30 wt % to about 99.9 wt % alumina, from about 40 wt % to about 99 wt % alumina, from about 50 wt % to about 97 wt % alumina, from about 60 wt % to about 95 wt % alumina, or from about 70 wt % to about 90 wt % alumina. In one or more embodiments, the proppants produced by the processes disclosed herein can include alumina, bauxite, or kaolin, or any mixture thereof. For example, the proppants can be composed entirely, of or composed essentially of alumina, bauxite, or kaolin, or any mixture thereof. The term "kaolin" is well known in the art and can include a raw material having an alumina content of at least about 40 wt % on a calcined basis and a silica content of at least about 40 wt % on a calcined basis. The term "bauxite" is well known in the art and can be or include a raw material having an alumina content of at least about 55 wt % on a calcined basis.

The proppants can also have any suitable size. According to one or more exemplary embodiments, the proppants can have a size of at least about 100 mesh, at least about 80 mesh, at least about 60 mesh, at least about 50 mesh, or at least about 40 mesh. For example, the proppants can have a size from about 115 mesh to about 2 mesh, about 100 mesh to about 3 mesh, about 80 mesh to about 5 mesh, about 80 mesh to about 10 mesh, about 60 mesh to about 12 mesh, about 50 mesh to about 14 mesh, about 40 mesh to about 16 mesh, or about 35 mesh to about 18 mesh. In a particular embodiment, the proppants have a size of from about 20 to about 40 U.S. Mesh.

According to certain embodiments described herein, the proppants are made in a continuous process, while in other embodiments, the proppants are made in a batch process.

An electrically conductive material such as a metal, a conductive polymer, or a conductive particle may be added at any suitable stage in the manufacturing process of any one of these proppants to result in an electrically conductive proppant suitable for use according to certain embodiments of the present invention. The electrically conductive material can also be added to any one of these proppants after manufacturing of the proppants. In one or more exemplary embodiments, the proppant can be a porous proppant, such that the electrically conductive material can be impregnated or infused into the pores of the proppant to provide the electrically conductive proppant. The porous proppant can be impregnated or infused with the electrically conductive material in any suitable amounts, such as from about 1% to 15% by weight. Water soluble coatings such as polylactic acid can be used to coat these particles to allow for delayed/timed release of conducting particles.

The electrically conductive material can be or include any suitable electrically, conductive metal. For example, the metal can be or include iron, silver, gold, copper, aluminum, calcium, tungsten, zinc, nickel, lithium, platinum, palladium, rhodium, tin, carbon steel, or any combination or oxide thereof. In one or more exemplary embodiments, the electrically conductive material can be selected from one or more of aluminum, copper, nickel, and phosphorus and any alloy or mixture thereof. The electrically conductive proppant can have an electrically conductive metal concentration of about 0.01 wt %, about 0.05 wt %, about 0.1 wt %, about 0.5 wt %, about 1 wt %, about 2 wt %, or about 5 wt % to about 6 wt %, about 8 wt %, about 10 wt %, about 12 wt %, or about 14 wt %. In one or more exemplary embodiments, the metals can include aluminum, copper and nickel and can be added to result in a proppant having a metal content of from about 5% to about 10% by weight.

The electrically conductive material can be or include any suitable electrically, conductive polymer. Suitable conductive polymers include poly(3,4-ethylenedioxythiophene) poly(styrenesulfonate) (PEDOT:PSS), polyanilines (PAM), and polypyrroles (PPY) and can be added to result in a proppant having any suitable conductive polymer content, such as from about 0.1% to about 10% by weight. In one or more exemplary embodiments, the electrically conductive proppant can have a conductive polymer concentration of about 0.01 wt %, about 0.05 wt %, about 0.1 wt %, about 0.5 wt %, about 1 wt %, about 2 wt %, or about 5 wt % to about 6 wt %, about 8 wt %, about 10 wt %, about 12 wt %, or about 14 wt %. Suitable PEDOT:PSS, PANT and PYY conductive polymers are commercially available from Sigma-Aldrich.

In one or more exemplary embodiments, the electrically conductive material can be added at any stage in a method of manufacture of a conventional ceramic proppant. The method of manufacture of a conventional ceramic proppant can be or include a method similar in configuration and operation to that described in U.S. Pat. No. 4,440,866, the entire disclosure of which a incorporated herein by reference. In one or more exemplary embodiments, the electrically conductive material can be added at any stage in a method of manufacture of drip cast proppant. Suitable drip casting methods and proppants made therefrom are disclosed in U.S. Pat. Nos. 8,865,631 and 8,883,693, U.S. Patent Application Publication No. 2012/0227968, and U.S. patent application Ser. No. 14/502,483, the entire disclosures of which are incorporated herein by reference.

According to certain embodiments of the present invention, the electrically conductive material is coated onto the proppants to provide the electrically conductive proppant. The coating may be accomplished by any coating technique well known to those of ordinary skill in the art such as spraying, sputtering, vacuum deposition, dip coating, extrusion, calendaring, powder coating, electroplating, transfer coating, air knife coating, roller coating and brush coating. In one or more exemplary embodiments, the electrically conductive material is coated onto the proppants with an electroless plating or coating method.

Figure 3:
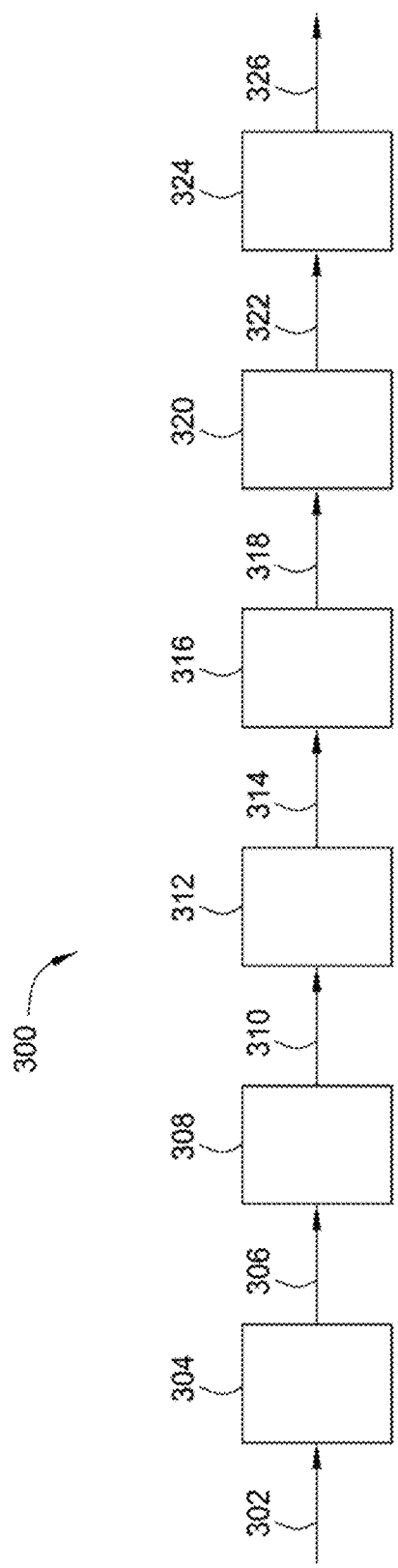
FIG. 3 is a flow chart showing steps of an electroless coating method for electrically conductive material onto a proppant substrate to provide the proppant particle of FIG. 1.

Referring now to FIG. 3, a flow chart is depicted showing steps of a process 300 for electroless coating of the electrically conductive material onto proppant utilizing a conditioning step. In the electroless coating process 300, a supply of proppant via line 302 can be introduced to one or more washing units 304 where the proppant via line 302 can be contacted with a first washing solution to remove dust and/or fines to provide a clean proppant via line 306. The washing unit 304 can be or include one or more tanks, one or more vessels, one or more conveyance systems, one or more conduits, or the like. The first washing solution can be or include an aqueous solution containing an acid or base, such as water containing dilute acid, or an organic phase solution, such as a liquid hydrocarbon, this washing can also be conducted at an elevated temperature. Clean proppant via line 306 can be withdrawn from the washing unit 304 and introduced to one or more pretreatment units 308 where the clean proppant via line 306 can be contacted with a conditioning solution. The pretreatment unit 308 can be or include one or more tanks, one or more vessels, one or more conveyance systems, one or more conduits, or the like. The conditioning solution can be or include an alkaline solution to adjust the pH of the surface of the proppant to alkaline levels (pH>7). The alkaline solution can include one or more of a hydroxide, ammonia, or a carbonate.

The conditioning in the pretreatment unit 308 can be further enhanced by combining or mixing a suitable surfactant with the conditioning solutions. Suitable surfactants can include, but are not limited to, anionic, cationic, nonionic, and amphoteric surfactants, or combinations thereof. According to several exemplary embodiments, suitable surfactants include but are not limited to saturated or unsaturated long-chain fatty acids or acid salts, long-chain alcohols, polyalcohols, polysorbates, dimethylpolysiloxane and polyethylhydrosiloxane. According to several exemplary embodiments, suitable surfactants include but are not limited to linear and branched carboxylic acids and acid salts having from about 4 to about 30 carbon atoms, linear and branched alkyl sulfonic acids and acid salts having from about 4 to about 30 carbon atoms, linear alkyl benzene sulfonate wherein the linear alkyl chain includes from about 4 to about 30 carbon atoms, sulfosuccinates, phosphates, phosphonates, phospholipids, ethoxylated compounds, carboxylates, sulfonates and sulfates, polyglycol ethers, amines, salts of acrylic acid, pyrophosphate and mixtures thereof. In one or more exemplary embodiments, the surfactant is a polysorbate, such as Tween™ 20 (PEG(20) sorbitan monolaurate).

The clean proppant via line 306 can contact the conditioning solution in the pretreatment unit 308 under any suitable conditions to provide a conditioned proppant via line 310. Suitable conditions can include a temperature of about 10° C., about 25° C., about 30° C., about 35° C., about 40° C., about 45° C., to about 47° C., about 50° C., about 55° C., about 60° C., about 75° C., or about 100 under a residence time of about 1 second (s), about 5 s, about 15 s, about 25 s, about 45 s, or about 55 s to about 65 s, about 75 s, about 100 s, about 2 minutes (min), about 5 min, or about 10 min. The conditioning solution can have a pH of at least about 7.2, at least about 8, at least about 8.5, at least about 9, at least about 10, at least about 11, at least about 12, at least about 12.5, or at least about 13.

The conditioned proppant via line 310 can be withdrawn from the pretreatment unit 308 and introduced to one or more turbidity reduction units 312 where the conditioned proppant via line 310 can be contacted with a second washing solution to further remove dust and/or fines to provide a washed proppant via line 314 having a reduced turbidity compared to the conditioned proppant via line 310. The turbidity reduction unit 312 can be or include one or more tanks, one or more vessels, one or more conveyance systems, one or more conduits, or the like. The second washing solution can be the same as or similar to the first washing solution and can include an aqueous solution, such as water, or an organic phase solution, such as a liquid hydrocarbon. The second washing solution can also have a sensitizer which aids the activator in the subsequent step. The sensitizer can be any agent that reduces the activator, such as tin chloride, sodium borohydride or sodium hypophosphite or any other known reducing agent. In one or more exemplary embodiments, the second washing solution does not contain the sensitizer. The sensitizer step would be followed by another rinse step, but in some embodiments may be omitted.

Washed proppant via line 314 can be withdrawn from the turbidity reduction unit 312 and introduced to one or more catalyst reduction units 316 where the washed proppant via line 314 can be contacted with an activation solution. The activation solution can activate the proppant by attaching catalytically active material, such as palladium or silver, to the proppant surface. The activation solution can be or include one or more palladium salts, such as palladium chloride or palladium ammonium chloride, and/or silver nitrate. The activation solution can be an aqueous phase solution or an organic phase solution. The activation solution can have a palladium salt concentration of about 0.1 milligrams of $Pd^{2+}$ per liter (mg/i), about 0.5 mg/l, about 1 about 5 mg/l, about 10 mg/l, or about 20 mg/l to about 30 mg/l, about 35 mg/l, about 40 mg/l, about 50 mg/l, or about 100 mg/l. The activation solution can also contain a reducing agent, or sensitizer. The reducing agent can be or include a tin salt, such as stannous chloride. In one or more exemplary embodiments, the activation solution does not contain the reducing agent.

The washed proppant via line 314 can contact the activation solution in the catalyst reduction unit 316 under any suitable conditions to provide an activated proppant via line 318. Suitable conditions can include a temperature of about 20° C., about 35° C., about 50° C., about 65° C., about 75° C., about 78° C. to about 82° C., about 85° C., about 90° C., about 95° C., about 100° C., or about 105 under a residence time of about 1 min, about 2 min, about 3 min, about 4 min, about 5 min, or about 7 min to about 8 min, about 9 min, about 10 min, about 12 min, about 15 min, or about 20 min or more and/or until the bath is substantially exhausted. The activation solution can have a pH of about 7.1, about 7.2, about 7.4, about 7.6, or about 7.8 to about 8, about 8.5, about 9, about 9.5, about 10, about 11, about 12, or about 13 or more.

The activated proppant via line 318 can be withdrawn from the activation unit 316 and introduced to one or more rinse units 320 where the activated proppant via line 318 can be contacted with a third washing solution to remove excess activation solution from the activated proppant. The rinse unit 320 can be or include one or more tanks, one or more vessels, one or more conveyance systems, one or more conduits, or the like. The third washing solution can include an aqueous solution, such as tap water or de-ionized water.

Rinsed proppant via line 322 can be withdrawn from the rinse unit 320 and introduced to one more metallization units 324 where the rinsed proppant via line 322 can be subjected to metal plating. In the metallization unit 324, the rinsed proppant via line 322 can be immersed in a plating bath solution having a temperature of about 20° C., about 35° C., about 50° C. about 60° C., or about 70° C. to about 75° C., about 80° C., about 90° C., about 95° C., about 100° C., about 110° C., or about 120° C. or more under a residence time of about 1 min, about 2 min, about 4 min about 8 min, about 12 min, or about 14 min to about 16 min, about 20 min, about 25 min, about 30 min, about 45 min, or about 60 min or more and/or until the bath is substantially exhausted. After immersion, a film of electrically conductive material ranging from about 10 nanometers (nm), about 50 nm, about 100 nm, about 250 nm, or about 400 nm to about 500 nm, about 600 nm, about 700 nm, about 800 nm, about 900 nm, about 1,000 nm, or about 1,200 nm or more can be non-uniformly coated onto the rinsed proppant to provide the electrically, conductive proppant such as the electrically conductive proppant 100 depicted in FIG. 1.

The plating bath solution can be an aqueous solution containing water or an organic phase solution containing one or more hydrocarbons. The plating bath solution can be basic or acidic and can include a metal salt, a complexing agent, a reducing agent, and a buffer. For example, the plating bath solution can include a salt of nickel such as nickel sulfate, nickel sulphate hexahydrate, and nickel chloride. The complexing agent can include acetate, succinate, aminoacetate, malonate, pyrophosphate, malate, or citrate or any combination thereof. The reducing agent can include sodium borohydride, dimethylamine borane, or hydrazine or any combination thereof. The buffer can include acetic acid, propionic acid, glutaric acid, succinic acid, or adipic acid or any combination thereof. Those of ordinary skill in the art will understand that any conventional electroless nickel, copper, silver or gold plating bath solution can also be utilized such as those that are commercially available from suppliers such as Uyemura, Transene, Caswell, and Metal-Chem.

Figure 4:
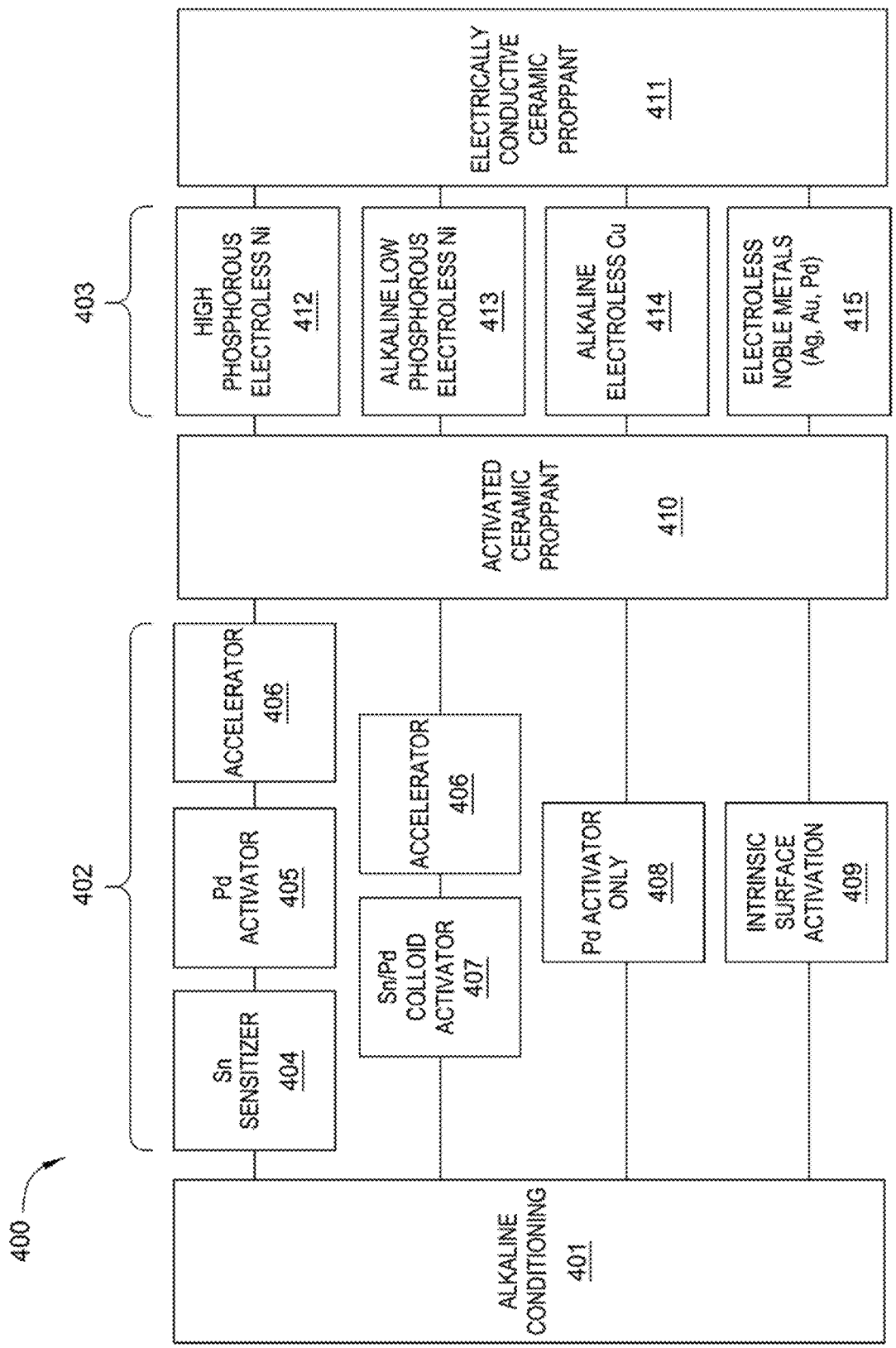
FIG. 4 is another flow chart showing alternative steps of an electroless coating method for electrically conductive material onto a proppant substrate to provide the proppant particle of FIG. 1.

Additional and/or alternative steps can be employed in the electroless plating process. Referring now to FIG. 4, a flow chart is depicted showing steps of a process 400 for electroless coating of the electrically conductive material onto proppant in which alternative activation and metal deposition steps are depicted. Proppant particles can be subjected to alkaline conditioning 401, which can be the same as or similar to the alkaline conditioning in the pretreatment unit 308, to provide conditioned proppant particles.

After being subjected to the alkaline conditioning step 401, the conditioned proppant particles can be subjected to an activation step 402 prior to electroless metal deposition 403. The conditioned particles can be sensitized using a sensitizer solution of tin(II) 404 to produce sensitized particles. After subsequent exposure to palladium(II) activation solution 405, palladium(II) is reduced to palladium metal ($Pd^{2+} \rightarrow Pd^0$) on the surface of the sensitized particles and tin(II) is oxidized to tin(IV) ($Sn^{2+} \rightarrow Sn^{4+}$). An accelerator solution 406 can be used to remove oxidized tin(IV) after exposure to palladium(II) activation solution 405 and prior to electroless metal deposition 403. Alternative embodiments involve a combined tin(IV) and palladium(II) activator and sensitizer colloidal suspension 407 which can be followed by the accelerator solution 406. The accelerator solution 406 can be an aqueous solution and can include one or more accelerator agents including, but not limited to, one or more organic sulfide compounds, such as bis(sodium-sulfopropyl)disulfide, 3-mercapto-1-propanesulfonic acid sodium salt, N,N-dimethyl-dithiocarbamyl propylsulfonic acid sodium salt or 3-S-isothiuronium propyl sulfonate, and mixtures thereof. Other suitable accelerator agents can include, but are not limited to, thiourea, allylthiourea, acetyl-thiourea, and pyridine and the like.

In certain embodiments, specific to proppant particle surfaces, the alkaline conditioning can enable activation using only the Pd activator as shown in step 408. The conditioned particles are activated using a solution of any suitable palladium salt, such as palladium chloride or palladium ammonium chloride, in a concentration of from about 0.1, about 0.5, about 1, about 5, about 10, about 15 or about 20 to about 25, about 30, about 35, about 40, or about 50 or more milligrams $Pd^{2+}$ per liter, where the pH of the solution can be adjusted between 7 and 14 using any suitable bases such as, for example, sodium hydroxide.

In one or more exemplary embodiments, intrinsic surface activation 409 can be accomplished prior to electroless metal deposition 403. In this embodiment, iron or any other suitable metal ion incorporated into the proppant particles during firing or sintering that are expressed at the surface of the proppant, can serve to directly activate the particles. In one or more exemplary embodiments, the surface of the particles is activated by soaking the particles in a reducing agent solution, such as sodium borohydride, sodium hypophosphite or sodium cyanoborohydride, where this solution can be transferred directly to the electroless plating bath with the particles still wet from the solution, or dried onto the particles prior to electroless metal plating 403, or rinsed completely from the particles.

Ceramic proppant particles can contain a significant amount of oxidized iron. In one or more exemplary embodiments of intrinsic surface activation 409, these iron moieties can be reduced to elemental iron, or other reduced form [iron (II)] which is catalytically active to copper, nickel and other noble metal electroless plating solutions. By utilizing the native iron content intrinsic to the particle, it is possible to plate onto the particles without Pd activators. The reduction of surface iron ions to atomic iron can occur within a sintering device, or subsequent to sintering, by maintaining a reducing environment in the kiln, which is characterized by the presence of carbon monoxide or other products of partial combustion. Iron on the surface of the proppant particles can also be reduced after manufacturing by exposing the surfaces of the proppant particles to carbon monoxide or hydrogen at any suitable temperatures such as, for example, about 200° C., about 300° C., about 400° C., about 500° C., or about 600° C. to about 75° C., about 900° C., about 1,100° C., or about 1,500° C.

After particle activation 402, activated proppant 410 can be converted into electrically conductive proppant 411 by electroless metal deposition 403. Processes for electrolytic and electroless coating are well-known to those of ordinary skill in the art. See, for example, U.S. Pat. No. 3,556,839, the entire disclosure of which is incorporated herein by reference. According to several exemplary embodiments, and in accordance with conventional autocatalytic or electroless plating methods, the activated proppant sample can be coated with metal and metal alloys by various methods.

After activation 402, the substrate can be immersed in, submerged in, or otherwise contacted with a plating bath of the electroless metal deposition 403 to provide the electrically conductive proppant 411. The plating bath can be heated to a temperature of from about 35° C., about 45° C., about 55° C., about 65° C., or about 75° C. to about 85° C., about 95° C., about 105° C., or about 120° C. or more. In one or more embodiments, the plating bath can be or include an acidic, nickel-containing bath with a high phosphorous content (about 5 wt % to about 12 wt % phosphorous by weight of the resulting nickel-phosphorous alloy film) 412. The high phosphorous content bath can include, for example, an aqueous solution containing a salt of nickel and a phosphorous-containing reducing agent such as sodium hypophosphite in the presence of salts such as sodium citrate and sodium acetate. The pH of the high phosphorous content bath solution can be from about 2, about 3, about 3.5, about 4, or about 4.5 to about 5, about 5.5, about 6, or about 6.5.

In one or more embodiments, the plating bath can be an alkaline, nickel-containing bath 413 with a low phosphorous content (about >1 wt % to about 4.9 wt % phosphorous by, weight of the resulting nickel-phosphorous alloy film). The pH of the alkaline plating bath 313 with a low phosphorous content can be from about 7, about 7.5, about 8, about 8.5, or about 9 to about 10, about 10.5, about 11, about 12, or about 13 or more. The alkaline plating bath 413 can chelate free nickel ions to prevent solution reactivity with Pd, as can occur with Pd solution drag out, and therefore offer a preferred reaction environment for high surface area materials such as ceramic proppant. Those of ordinary skill in the art will understand that any conventional electroless nickel, copper, silver or gold plating bath solution may be utilized with any range of pH such as those that are commercially available from suppliers such as Metal-Chem, Enthone, Uyemura, Transene or Caswell. In one or more exemplary embodiments, the plating bath can be or include alkaline electroless copper 414 containing formaldehyde as a reducing agent. In one or more exemplary embodiments, the plating bath can include electroless noble metals 415, such as silver, gold, and platinum. For example, the plating bath can be or include a silver nitrate solution.

The electrically conductive material can also be incorporated into a resin material. Ceramic proppant or natural sands can be coated with the resin material containing the electrically conductive material such as metal clusters, metal flake, metal shot, metal powder, metalloids, metal nanoparticles, quantum dots, carbon nanotubes, buckminsterfullerenes, and other suitable electrically conductive materials to provide electrically conductive material-containing proppant that can be detected by electromagnetic means. Processes for resin coating proppants and natural sands are well known to those of ordinary skill in the art. For example, a suitable solvent coating process is described in U.S. Pat. No. 3,929,191, to Graham et al., the entire disclosure of which is incorporated herein by reference. Another suitable process such as that described in U.S. Pat. No. 3,492,147 to Young et al., the entire disclosure of which is incorporated herein by reference, involves the coating of a particulate substrate with a liquid, uncatalyzed resin composition characterized by its ability to extract a catalyst or curing agent from a non-aqueous solution. Also, a suitable hot melt coating procedure for utilizing phenol-formaldehyde novolac resins is described in U.S. Pat. No. 4,585,064, to Graham et al., the entire disclosure of which is incorporated herein by reference. Those of ordinary skill in the art will be familiar with still other suitable methods for resin coating proppants and natural sands.

According to certain embodiments of the present invention, the electrically conductive material is incorporated into a resin material and ceramic proppant or natural sands are coated with the resin material containing the electrically conductive material. Processes for resin coating proppants and natural sands are well known to those of ordinary skill in the art. For example, a suitable solvent coating process is described in U.S. Pat. No. 3,929,191, to Graham et al., the entire disclosure of which is incorporated herein by reference. Another suitable process such as that described in U.S. Pat. No. 3,492,147 to Young et al., the entire disclosure of which is incorporated herein by reference, involves the coating of a particle substrate with a liquid, uncatalyzed resin composition characterized by its ability to extract a catalyst or curing agent from a non-aqueous solution. Also a suitable hot melt coating procedure for utilizing phenol-formaldehyde novolac resins is described in U.S. Pat. No. 4,585,064, to Graham et al, the entire disclosure of which is incorporated herein by reference. Those of ordinary skill in the art will be familiar with still other suitable methods for resin coating proppants and natural sands.

According to several exemplary embodiments, the proppants disclosed herein are coated with a resin material to provide resin coated proppant particulates. According to several exemplary embodiments, the electrically conductive material can be mixed with the resin material and coated onto the proppants to provide the resin coated proppant particulates. According to several exemplary embodiments, at least a portion of the surface area of each of the resin coated proppant particulates is covered with the resin material. According to several exemplary embodiments, at least about 10%, at least about 25%, at least about 50%, at least about 75%, less than 90%, less than 95%, or less than 99% of the surface area of the resin coated proppant particulates is covered with the resin material. According to several exemplary embodiments, about 40% to about 90%, about 25% to about 80%, or about 10% to about 50% of the surface area of the resin coated proppant particulates is covered with the resin material. According to several exemplary embodiments, the entire surface area of the resin coated proppant particulates is covered with the resin material. For example, the resin coated proppant particulates can be encapsulated with the resin material.

According to several exemplary embodiments, the resin material is present on the resin coated proppant particulates in any suitable amount. According to several exemplary embodiments, the resin coated proppant particulates contain at least about 0.1 wt % resin, at least about 0.5 wt % resin, at least about 1 wt % resin, at least about 2 wt % resin, at least about 4 wt % resin, at least about 6 wt % resin, at least about 10 wt % resin, or at least about 20 wt % resin, based on the total weight of the resin coated proppant particulates. According to several exemplary embodiments, the resin coated proppant particulates contain about 0.01 wt %, about 0.2 wt %, about 0.8 wt %, about 1.5 wt %, about 2.5 wt %, about 3.5 wt %, or about 5 wt % to about 8 wt %, about 15 wt %, about 30 wt %, about 50 wt %, or about 80 wt % resin, based on the total weight of the resin coated proppant particulates.

According to several exemplary embodiments, the resin material includes any, suitable resin. For example, the resin material can include a phenolic resin, such as a phenol-formaldehyde resin. According to several exemplary embodiments, the phenol-formaldehyde resin has a molar ratio of formaldehyde to phenol (F:P) from a low of about 0.6:1, about 0.9:1, or about 1.2:1 to a high of about 1.9:1, about 2.1:1, about 2.3:1, or about 2.8:1. For example, the phenol-formaldehyde resin can have a molar ratio of formaldehyde to phenol of about 0.7:1 to about 2.7:1, about 0.8:1 to about 2.5:1, about 1:1 to about 2.4:1, about 1.1:1 to about 2.6:1, or about 1.3:1 to about 2:1. The phenol-formaldehyde resin can also have a molar ratio of formaldehyde to phenol of about 0.8:1 to about 0.9:1, about 0.9:1 to about 1:1, about 1:1 to about 1.1:1, about 1.1:1 to about 1.2:1, about 1.2:1 to about 1.3:1, or about 1.3:1 to about 1.4:1.

According to several exemplary embodiments, the phenol-formaldehyde resin has a molar ratio of less than 1:1, less than 0,9:1, less than 0.8:1, less than 0.7:1, less than 0.6:1, or less than 0.5:1. For example, the phenol-formaldehyde resin can be or include a phenolic novolac resin. Phenolic novolac resins are well known to those of ordinary skill in the art, for instance see U.S. Pat. No. 2,675,335 to Rankin, U.S. Pat. No. 4,179,429 to Hanauye, U.S. Pat. No. 5,218,038 to Johnson, and U.S. Pat. No. 8,399,597 to Pullichola, the entire disclosures of which are incorporated herein by reference. Suitable examples of commercially available novolac resins include novolac resins available from Plenco™, Durite® resins available from Momentive, and novolac resins available from S.I. Group.

The electrically conductive material can also be in the form of particles and/or nanoparticles that are separate and distinct from the proppant particles prior to injection into the formation. The electrically conductive particles can be or include pyrolytic carbon, carbon black, graphite, coke breeze, carbon fiber, or carbon nanotubes or any mixture or combination thereof. The electrically conductive particles can be or include any suitable magnetic material. In one or more exemplary embodiments, the electrically conductive particles can be or include any suitable metallic and/or non-metallic material. The electrically conductive particles can be or include any metal selected from Groups 3-12 of the Periodic Table or any oxides thereof. For example, the electrically conductive particles can be or include iron, cobalt, nickel, gadolinium, or oxides thereof, or any combination or mixture thereof. The electrically conductive particles can also be or include ferromagnetic particles. The electrically conductive particles can be or include aluminum, boron, or carbon or any combination or mixture thereof.

The electrically conductive particles can survive or remain stable under any suitable downhole conditions. According to several exemplary embodiments, the electrically conductive particles are survivable under downhole conditions. According to several exemplary embodiments, the electrically conductive particles are survivable under temperatures of at least about 100° C., at least about 125° C., at least about 150° C., or at least about 300° C. In one or more embodiments, the electrically conductive particles are survivable at temperatures of about 80° C., about 120° C., about 160° C., or about 200° C., to about 250° C., about 300° C., about 350° C., or about 400° C. According to several exemplary embodiments, the electrically conductive particles do not degrade due to being under temperatures of at least about 100° C., at least about 125° C., at least about 150° C., or at least about 300° C. In one or more embodiments, the electrically conductive particles do not degrade due to being at temperatures of about 80° C., about 120° C., about 160° C., or about 200° C. to about 250° C., about 300° C., about 350° C., or about 400° C.

The electrically conductive particles can have any suitable size. The electrically conductive particles can have a size from about 1 nanometers (nm), about 5 nm, about 10 nm, about 50 nm, about 100 nm, or about 500 nm in their largest dimension. For example, the electrically conductive particles can be from about 2 nm to about 500 nm, about 25 nm to about 450 nm, about 150 nm to about 400, about 250 nm to about 350 nm, or about 275 nm to about 325 nm in their largest dimension. The electrically conductive particles can be or include nanoparticles. According to several exemplary embodiments, the electrically conductive particles are nanoparticles. In one or more exemplary embodiments, the nanoparticles are nanowires.

The electrically conductive particles can have a size of at least about 100 mesh, at least about 80 mesh, at least about 60 mesh, at least about 50 mesh, or at least about 40 mesh. For example, the electrically conductive particles can have a size from about 115 mesh to about 2 mesh, about 100 mesh to about 3 mesh, about 80 mesh to about 5 mesh, about 80 mesh to about 10 mesh, about 60 mesh to about 12 mesh, about 50 mesh to about 14 mesh, about 40 mesh to about 16 mesh, or about 35 mesh to about 18 mesh. In a particular embodiment, the electrically conductive particles have a size of from about 20 to about 40 U.S. Mesh.

The electrically conductive particles can be present in any suitable amounts. For example, the electrically conductive particles can be present in an electrically conductive particle to proppant weight ratio of about 1:1,000, about 1:1,000, about 1:500, about 1:200, about 1:100, or about 1:50 to about 1:25, about 1:20, about 1:15, about 1:10, about 1:8, about 1:4, about 1:3, about 1:2, or about 1:1 or more.

In one or more exemplary embodiments, the electrically conductive particles are treated and/or coated with one or more chemicals or ligands to impart surface functionality to the electrically conductive particles. These coatings can be selected from organic compound containing materials and/or organic compounds of varying chain lengths, each having functional groups on the terminus of their respective chains to modify or tailor the affinity of the electrically conductive particles with surface functionality of the proppant. Many commercially available surfactants can be used for this purpose. Ligands that are multi-functional can also be used as a coating, with one end of the ligand molecule binding to at least a portion of the electrically conductive particle and the other end of the ligand molecule affecting the dispersibility of the functionalized nanoparticle in the desired organic or aqueous solvent or carrier fluid so that the electrically conductive particle are not completely "soluble" in the carrier fluid or production fluid to cause the electrically conductive particles to have a tendency to settle and remain on proppant surfaces and not be mixed with and thus carried away with any produced fluids. These multi-functional ligands can be modified by traditional organic synthetic methods and principles to decrease solubility of the electrically conductive particles in organic and/or aqueous reservoir fluids, which can affect the settling rate of the electrically conductive particles. The property of the terminus groups on the multi-functional ligand molecule can also affect the solubility of the electrically conductive particle in the fluid. Examples of the types of functional groups that can be used are carboxylates, amities, thiols, polysiloxanes, silanes, alcohols, and other species capable of binding to the electrically conductive particle and providing binding affinity to the proppant surface. In one or more exemplary embodiments, the electrically conductive particles can adhere to and/or coat the proppant particles after the electrically conductive particles encounter the proppant in a downhole environment, for example a subterranean fracture. In one or more exemplary embodiments, the particles can self-accumulate in the downhole environment or subterranean fracture. For example, the electrically conductive particles can have a modified surface functionalization that encourages or causes the electrically conductive particles to adhere or bind to one another in groups or clusters in a downhole or subterranean environment. In one or more exemplary embodiments, the electrically conductive particles can bind to one another to form clusters of electrically conductive particles having a size that can be the same as or similar to the size of the proppant.

Figure 5:
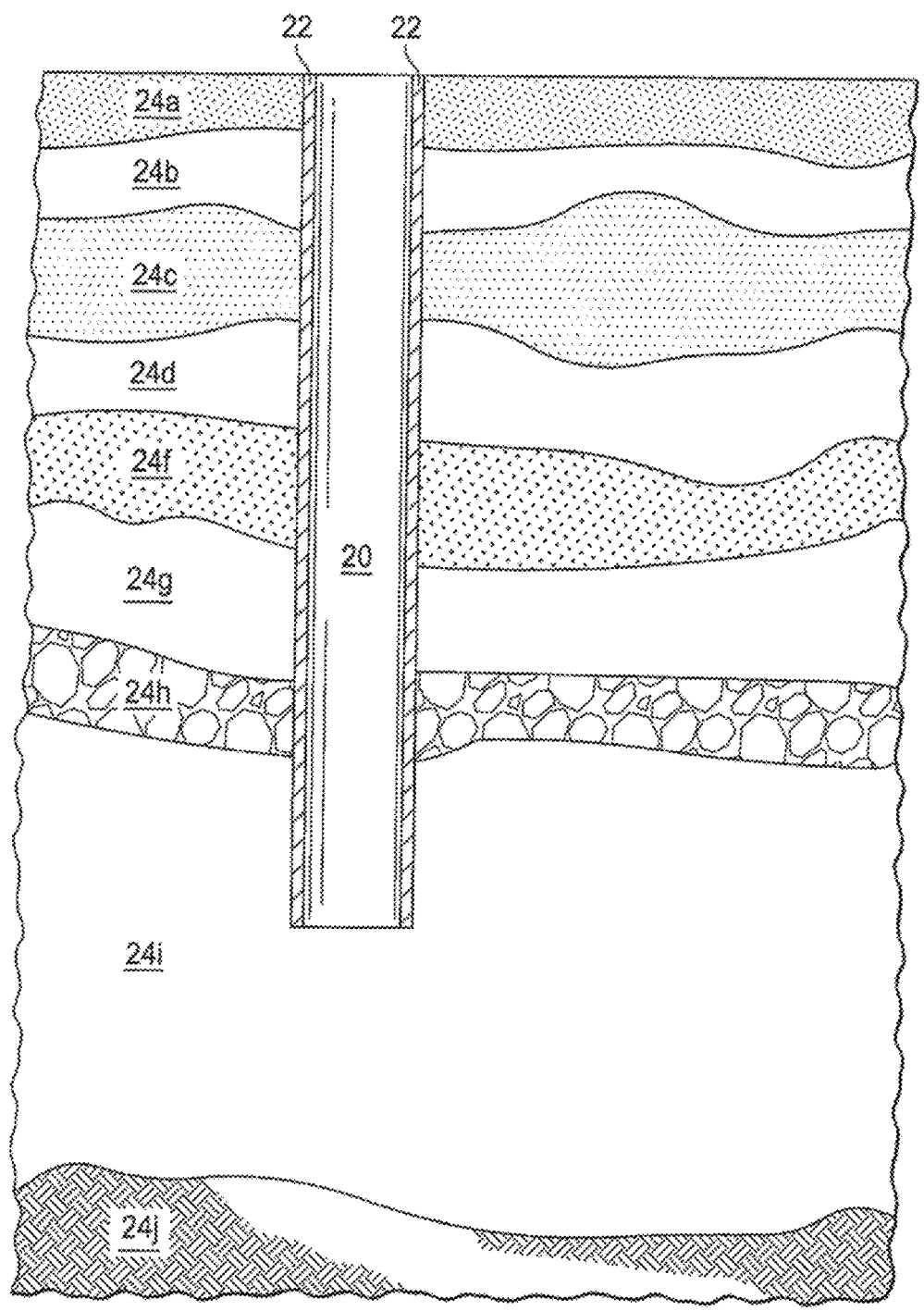
FIG. 5 is a diagram of the geometric layout of a vertical or deviated well in which layers of the earth having varying electrical and mechanical properties are depicted.

The electromagnetic methods described herein can include electrically energizing the earth at or near a fracture at depth and measuring the electric and magnetic responses at the earth's surface or in adjacent wells/boreholes. The electromagnetic methods described herein can include energizing the earth in the fractured well/borehole or in a well/borehole adjacent to the fractured well/borehole. The electromagnetic methods described herein are can be used in connection with a cased wellbore, such as well 20 shown in FIG. 5, or in an encased wellbore (not shown). As shown in FIG. 5, casing 22 extends within well 20 and well 20 extends through geological strata 24a-24i in a manner that has three dimensional components.

Figure 6:
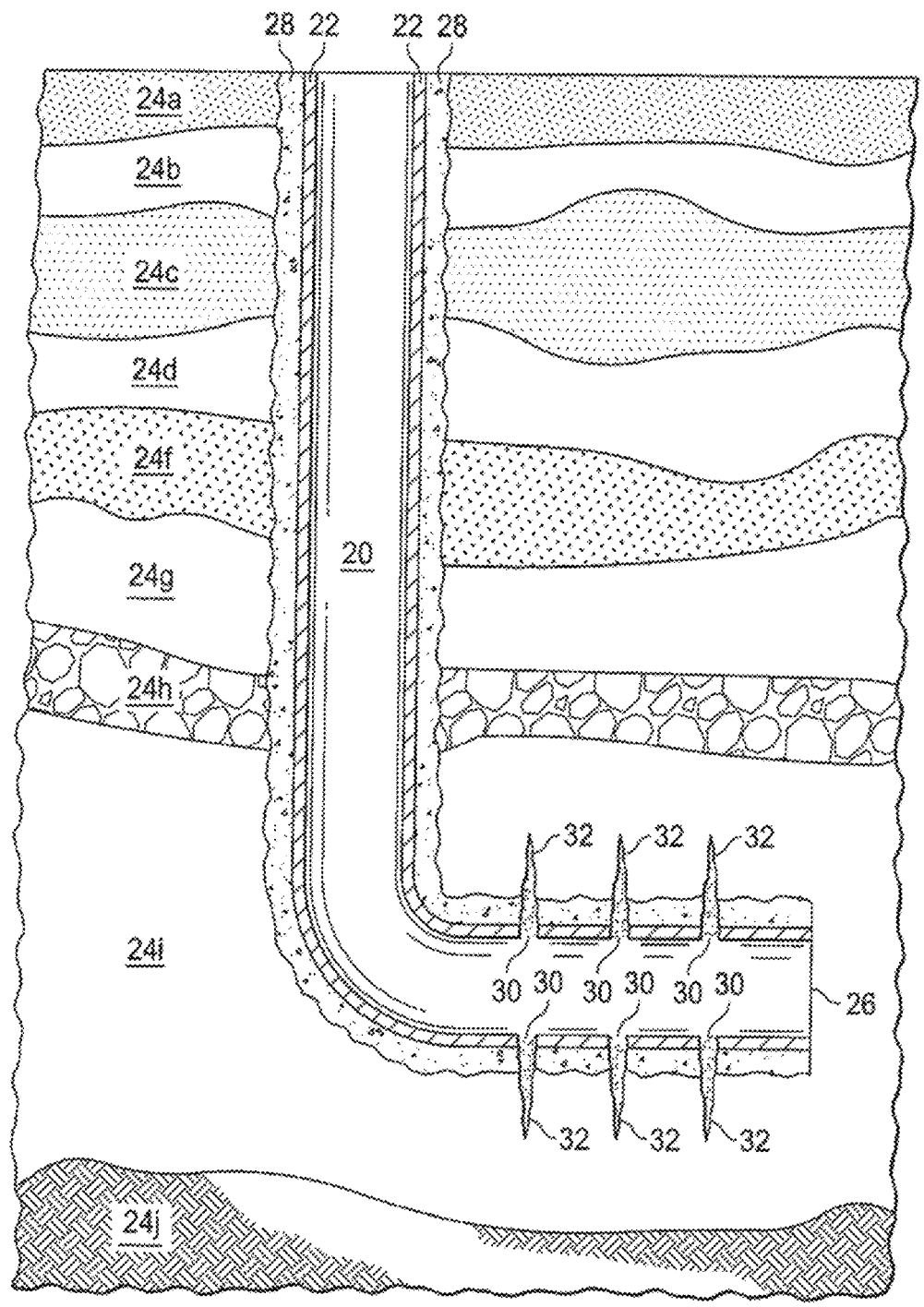
FIG. 6 is a schematic of an installed horizontal wellbore casing string traversing a hydrocarbon bearing zone with proppant filled fractures in which layers of the earth having varying electrical and mechanical properties are depicted.

Referring now to FIG. 6, a partial cutaway view is shown with production well 20 extending vertically downward through one or more geological layers 24a-24i and horizontally in layer 24i. While wells are conventionally vertical, the electromagnetic methods described herein are not limited to use with vertical wells. Thus, the terms "vertical" and "horizontal" are used in a general sense in their reference to wells of various orientations.

The preparation of production well 20 for hydraulic fracturing can include drilling a bore 26 to a desired depth and then in some cases extending the bore 26 horizontally so that the bore 26 has any desired degree of vertical and horizontal components. A casing 22 can be cemented 28 into well 20 to seal the bore 26 from the geological layers 24a-24i in FIG. 6. The casing 22 can have a plurality of perforations 30 and/or sliding sleeves (not shown) The perforations 30 are shown in FIG. 6 as being located in a horizontal portion of well 20 but those of ordinary skill in the art will recognize that the perforations can be located at any desired depth or horizontal distance along the bore 26, but are typically at the location of a hydrocarbon bearing zone in the geological layers 24, which may be within one or more of the geological layers 24a-24j. Those of ordinary skill in the art will also recognize that the well 20 can include no casing, such as in the case of an open-hole well. The hydrocarbon bearing zone may contain oil and/or gas, as well as other fluids and materials that have fluid-like properties. The hydrocarbon bearing zone in geological layers 24a-24j is hydraulically fractured by pumping a fluid into casing 22 and through perforations 30 at sufficient rates and pressures to create fractures 32 and then incorporating into the fluid an electrically conductive proppant which will prop open the created fractures 32 when the hydraulic pressure used to create the fractures 32 is released.

The hydraulic fractures 32 shown in FIG. 6 are oriented radially away from the metallic well casing 22. This orientation is exemplary in nature. In practice, hydraulically-induced fractures 32 may be oriented radially as in FIG. 6, laterally or intermediate between the two. Various orientations are exemplary and not intended to restrict or limit the electromagnetic methods described herein in any way.

The electrically conductive proppant can be introduced into one or more subterranean fractures during any suitable hydraulic fracturing operation to provide an electrically conductive proppant pack. The electrically conductive proppant pack can include the electrically conductive proppant pack 200 depicted in FIG. 2. In one or more exemplary hydraulic fracturing operations, any combination of the electrically conductive proppant and a non-electrically conductive proppant can be introduced into one or more fractures to provide an electrically conductive proppant pack. The electrically conductive proppant of the electrically conductive proppant pack can include a non-uniform coating of electrically conductive material as disclosed herein and/or a substantially uniform coating of electrically conductive material.

The substantially uniform coating of electrically conductive material can have any suitable thickness. In one or more exemplary embodiments, the substantially uniform coating of electrically conductive material can have a thickness of about 5 nm, about 10 nm, about 25 nm, about 50 nm, about 100 nm, or about 200 nm to about 300 nm, about 400 nm, about 500 nm, about 750 nm, about 1,000 about 1,500 nm, about 2,000 nm, or about 5,000 nm. For example, the thickness of the substantially uniform coating of electrically conductive material can be from about 400 nm to about 1,000 nm, from about 200 nm to about 600 nm, or from about 100 nm to about 400 nm.

The electrically conductive proppant pack can include non-electrically conductive proppant in any suitable amounts. The non-electrically conductive proppant can have any, suitable resistivity. For example, the non-electrically conductive proppant can have a resistivity of at least about $1 \times 10^5$ Ohm-cm, at least about $1 \times 10^8$ Ohm-cm, at least about $1 \times 10^{10}$ Ohm-cm, at least about $1 \times 10^{11}$ Ohm-cm, or at least about $1 \times 10^{12}$ Ohm-cm. The electrically conductive proppant pack can include any suitable amount of non-electrically conductive proppant. In one or more exemplary embodiments, the electrically conductive proppant pack can include at least about 1 wt %, at least about 5 wt %, at least about 10 wt %, at least about 20 wt %, at least about 40 wt %, at least about 50 wt %, at least about 60 wt %, at least about 70 wt %, at least about 80 wt %, at least about 90 wt %, or at least about 95 wt % non-electrically conductive proppant. In one or more exemplary embodiments, the electrically conductive proppant pack can include at least about 1 wt %, at least about 5 wt %, at least about 10 wt %, at least about 20 wt %, at least about 40 wt %, at least about 50 wt %, at least about 60 wt %, at least about 70 wt %, at least about 80 wt %, at least about 90 wt %, or at least about 95 wt % electrically conductive proppant. In one or more exemplary embodiments, the electrically conductive proppant pack can have an electrically conductive proppant concentration of about 2 wt %, about 4 wt %, about 8 wt %, about 12 wt %, about 25 wt %, about 35 wt %, or about 45 wt % to about 55 wt %, about 65 wt %, about 75 wt %, about 85 wt %, or about 95 wt % based on the total weight of the proppant pack. In one or more exemplary embodiments, the electrically conductive proppant pack can include from about 1 wt % to about 10 wt %, from about 10 wt % to about 25 wt %, about 25 wt % to about 50 wt %, from about 50 wt % to about 75 wt %, or from about 75 wt % to about 99 wt % non-electrically conductive proppant.

The non-electrically conductive proppant can be dispersed throughout the electrically conductive proppant pack in any suitable manner. For example, the non-electrically conductive proppant can be substantially evenly dispersed throughout the electrically conductive proppant pack. In one or more exemplary embodiments, the proppant pack has a minimum threshold concentration of electrically conductive proppant needed to make the proppant pack electrically conductive when the non-electrically conductive proppant are substantially evenly dispersed throughout the proppant pack. The minimum threshold concentration of electrically conductive proppant can be least about 20%, at least about 25%, at least about 30%, or at least about 35%, based on the total number of proppant particles in the proppant pack. In one or more exemplary embodiments, the minimum threshold concentration of electrically conductive proppant can be from about 20% to about 40%, from about 25% to about 35%, from about 28% to about 32%, or from about 30% to about 33%, based on the total number of proppant particles in the proppant pack.

The electrically conductive proppant pack containing the non-conductive proppant can have any suitable resistivity. In one or more exemplary embodiments, the electrically conductive proppant pack containing at least about 20 wt %, at least about 40 wt %, at least about 50 wt %, or at least about 60 wt % non-conductive proppant can have a resistivity of less than 1,000 Ohm-cm, less than 500 Ohm-cm, less than 200 Ohm-cm, less than 100 Ohm-cm, less than 80 Ohm-cm, less than 50 Ohm-cm, less than 2.5 Ohm-cm, less than 15 Ohm-cm, less than 5 Ohm-cm, less than 2 Ohm-cm, less than 1 Ohm-cm, less than 0.5 Ohm-cm, or less than 0.1 Ohm-cm. The electrically conductive proppant pack containing the non-conductive proppant can have any suitable electrical conductivity. In one or more exemplary embodiments, the electrically conductive proppant pack containing at least about 20 wt %, at least about 40 wt %, at least about 50 wt %, or at least about 60 wt % non-conductive proppant can have an electrical conductivity of at least about 0.1 Siemen-m, at least about 0.5 Siemen-m, at least about 1 Siemen-m, at least about 5 Siemen-m, at least about 15 Siemen-m, at least about 50 Siemen-m, at least about 100 Siemen-m, at least about 250 Siemen-m, at least about 500 Siemen-m, at least about 750 Siemen-m, at least about 1,000 Siemen-m, at least about 1,500 Siemen-m, or at least about 2,000 Siemen-m.

According to certain embodiments of the electromagnetic method of the present invention and as shown schematically in FIG. 7, electric current is carried down wellbore 20 to an energizing point which will generally be located within 10 meters or more (above or below) of perforations 30 in casing 22 via a seven strand wire line insulated cable 34, such as those which are well known to those of ordinary skill in the art and are widely commercially available from Camesa Wire, Rochester Wire and Cable, Inc., WireLine Works, Novametal Group, and Quality Wireline & Cable Inc. In other exemplary embodiments, the wire line insulated cable 34 can contain 1 to 6 strands or 8 or more strands. A sinker bar 36 connected to the wire line cable 34 contacts or is in close proximity to the well casing 22 whereupon the well casing 22 becomes a current line source that produces subsurface electric and magnetic fields. In other exemplary embodiments, the wire line cable 34 can be connected to or otherwise attached to a centralizer and/or any other suitable downhole tool in addition to or in lieu of the sinker bar 26. These fields interact with the fracture 32 containing electrically conductive proppant to produce secondary electric and magnetic fields that will be used to detect, locate, and characterize the proppant-filled fracture 32.

Figure 7:
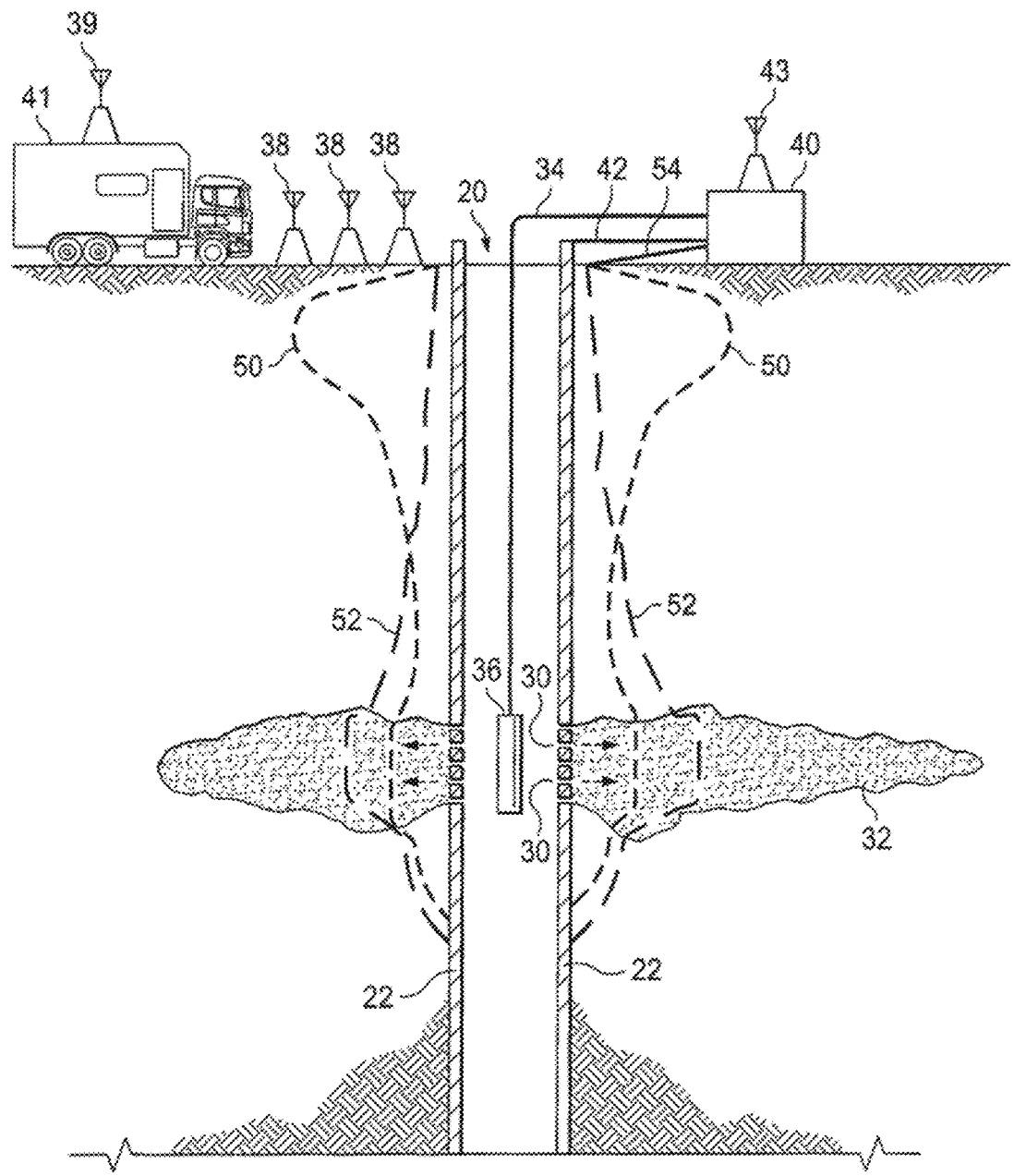
FIG. 7 is a schematic cross-sectional illustration of a hydraulic fracture mapping system which depicts two embodiments for introducing electric current into a wellbore, namely energizing the wellbore at the surface and energizing via a wireline with a sinker bar near perforations in the wellbore.

According to certain embodiments of the electromagnetic method of the present invention and as shown schematically in FIG. 7, a power control box 40 is connected to casing 22 by a cable 42 so that electric current is injected into the fracture well 20 by directly energizing the casing 22 at the well head or any other suitable surface location. In one embodiment, the power control box 40 is connected wirelessly by a receiver/transmitter 43 to a receiver/transmitter 39 on equipment truck 41. Those of ordinary skill in the art will recognize that other suitable means of carrying the current to the energizing point may also be employed.

Figure 8:
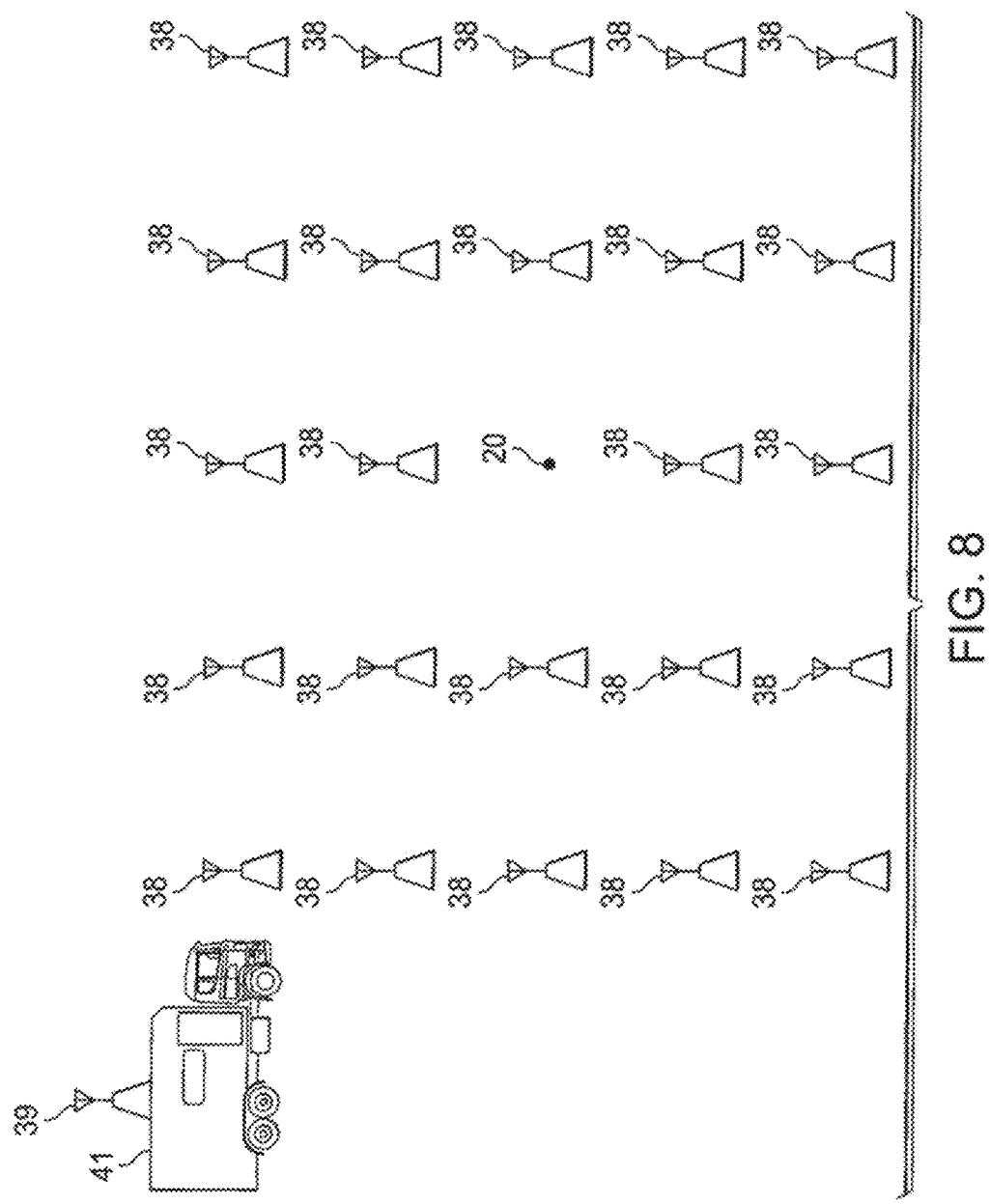
FIG. 8 is a schematic plan illustration of a hydraulic fracture mapping system.

As shown schematically in FIGS. 7-9, a plurality of electric and magnetic field sensors 38 will be located on the earth's surface in a rectangular or other suitable array covering the area around the fracture well 20 and above the anticipated fracture 32. In one embodiment, the sensors 38 are connected wirelessly to a receiver/transmitter 39 on equipment truck 41. The maximum dimension of the array (aperture) in general should be at least 80 percent of the depth to the fracture zone. The sensors 38 will measure the x, y and z component responses of the electric and magnetic fields. It is these responses that will be used to infer location and characterization of the electrically conductive proppant through comparison to numerical simulations and/or inversion of the measured data to determine the source of the responses. The responses of the electric and magnetic field components will depend upon: the orientation of the fracture well 20, the orientation of the fracture 32, the electrical conductivity, magnetic permeability, and electric permittivity of layers 24a-24j, the electrical conductivity, magnetic permeability, and electric permittivity of the proppant filled fracture 32, and the volume of the proppant filled fracture 32. Moreover, the electrical conductivity, magnetic permeability and electric permittivity of the geological layers residing between the surface and the target formation layers 24a-24j influence the recorded responses. From the field-recorded responses, details of the proppant filled fracture 32 can be determined.

In another embodiment, electric and/or magnetic sensors may be located in adjacent well/boreholes. The adjacent well/boreholes can be in one or more new or pre-existing hydrocarbon production wells, water production wells, and/or water injection wells. The new or pre-existing wells can be off-set from the fracture(s) by any suitable distance. For example, the wells can be off-set from the fracture(s) by about 0.5 meter (m), about 1 m, about 2 m, about 5 m to about 7 m, about 10 m, about 15 m, about 20 m, or about 50 m or more. In one or more exemplary embodiment the adjacent well/borehole can bisect, intersect, abut or otherwise be disposed proximate to a fracture. In one or more exemplary embodiments, the adjacent well/borehole can be drilled and/or placed before, during or after the fracture has been formed. The adjacent well/borehole can be a test well that is drilled to bisect, intersect, abut or otherwise be disposed proximate to a fracture.

Figure 10A:
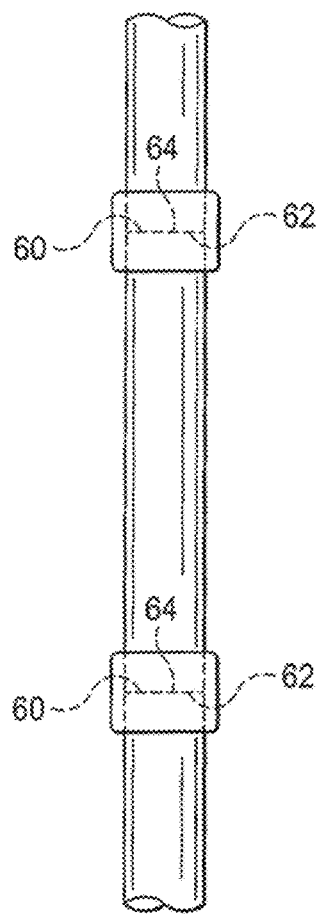
FIG. 10A is a schematic illustration of an electrically insulated casing joint.
Figure 10B:
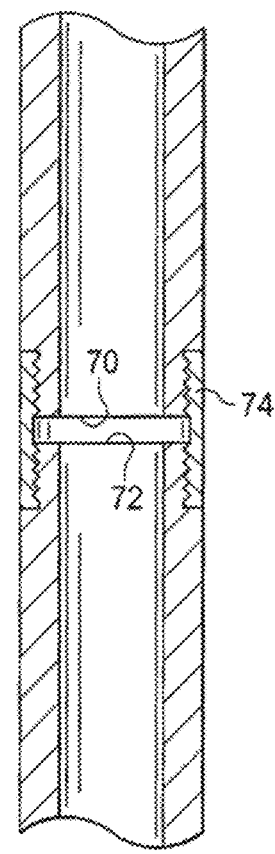
FIG. 10B is a schematic illustration of an electrically insulated casing collar.

Depending upon the conductivity of the earth surrounding the well casing 22, the current may or may not be uniform as the current flows back to the surface along the well casing 22. According to both embodiments shown in FIG. 7, current leakage occurs along wellbore 20 such as along path 50 or 52 and returns to the electrical ground 54 which is established at the well head. As described in U.S. patent application Ser. No. 13/206,041 filed Aug. 9, 2011 and entitled "Simulating Current Flow Through a Well Casing and an Induced Fracture," the entire disclosure of which is incorporated herein by reference, the well casing is represented as a leaky transmission line in data analysis and numerical modeling. Numerical simulations have shown that for a conducting earth (conductivity greater than approximately 0.05 siemens per meter (S/m)), the current will leak out into the formation, while if the conductivity is less than approximately 0.05 S/m the current will be more-or-less uniform along the well casing 22. As shown in FIGS. 10A and 10B, to localize the current in the well casing 22, electrically insulating pipe joints or pipe collars may be installed. According to the embodiment shown in FIG. 10A, an insulating joint may be installed by coating the mating surfaces 60 and 62 of the joint with a material 64 having a high dielectric strength, such as any one of the well-known and commercially available plastic or resin materials which have a high dielectric strength and which are of a tough and flexible character adapted to adhere to the joint surfaces so as to remain in place between the joint surfaces. As described in U.S. Pat. No. 2,940,787, the entire disclosure of which is incorporated herein by reference, such plastic or resin materials include epoxies, phenolics, rubber compositions, and alkyds, and various combinations thereof. Additional materials include polyetherimide and modified polyphenylene oxide. According to the embodiment shown in FIG. 10B, the mating ends 70 and 72 of the joint are engaged with an electrically insulated casing collar 74. The transmission line representation is able to handle various well casing scenarios, such as vertical only, slant wells, vertical and horizontal sections of casing, and, single or multiple insulating gaps.

The detection, location, and characterization of the electrically conductive proppant in a fracture will depend upon several factors, including but not limited to the net electrical conductivity of the fracture, fracture volume, the electrical conductivity, magnetic permeability, and electric permittivity of the earth surrounding the fracture and between the fracture and surface mounted sensors. The net electrical conductivity of the fracture means the combination of the electrical conductivity of the fracture, the proppant and the fluids when all are placed in the earth minus the electrical conductivity of the earth formation when the fracture, proppant and fluids were not present. Also, the total electrical conductivity of the proppant filled fracture is the combination of the electrical conductivity created by making a fracture, plus the electrical conductivity of the new/modified proppant plus the electrical conductivity of the fluids, plus the electro-kinetic effects of moving fluids through a porous body such as a proppant pack. The volume of an overly simplified fracture with the geometric form of a plane may be determined by multiplying the height, length, and width (i.e. gap) of the fracture. A three dimensional (3D) finite-difference electromagnetic algorithm that solves Maxwell's equations of electromagnetism may be used for numerical simulations. In order for the electromagnetic response of a proppant filled fracture at depth to be detectable at the Earth's surface, the net fracture conductivity, multiplied by the fracture volume within one computational cell of the finite difference (FD) grid must be larger than approximately 100 $Sm^2$ for a Barnett shale-like model where the total fracture volume is approximately 38 $m^3$. For the Barnett shale model, the depth of the fracture is 2000 m. These requirements for the numerical simulations can be translated to properties in a field application for formations other than the Barnett shale.

The propagation and/or diffusion of electromagnetic (EM) wavefields through three-dimensional (3D) geological media are governed by Maxwell's equations of electromagnetism.

According to one embodiment of the present invention, the measured three dimensional components of the electric and/or magnetic field responses may be analyzed with imaging methods such as an inversion algorithm based on Maxwell's equations and electromagnetic migration and/or holography to determine proppant pack location. Inversion of acquired data to determine proppant pack location involves adjusting the earth model parameters, including but not limited to the proppant location within a fracture or fractures and the net electrical conductivity of the fracture, to obtain the best fit to forward model calculations of responses for an assumed earth model. As described in Bartel, L. C., Integral wave-migration method applied to electromagnetic data, SEG Technical Program Expanded Abstracts, 1994, 361-364, the electromagnetic integral wave migration method utilizes Gauss's theorem where the data obtained over an aperture is projected into the subsurface to form an image of the proppant pack. Also, as described in Bartel, L. C., Application of EM Holographic Methods to Borehole Vertical Electric Source Data to Map a Fuel Oil Spill, SEG Technical Program Expanded Abstracts, 1987, 49-51, the electromagnetic holographic method is based on the seismic holographic method and relies on constructive and destructive interferences where the data and the source wave form are projected into an earth volume to form an image of the proppant pack. Due to the long wave lengths of the low frequency electromagnetic responses for the migration and holographic methods, it may be necessary to transform the data into another domain where the wave lengths are shorter. As described in Lee, K. H., et al., A new approach to modeling the electromagnetic response of conductive media, Geophysics, Vol. 54, No. 9 (1989), this domain is referred to as the q-domain. Further, as described in Lee, K. H., et al., Tomographic Imaging of Electrical Conductivity Using Low-Frequency Electromagnetic Fields, Lawrence Berkeley 1992, the wave length changes when the transformation is applied.

Also, combining Maxwell's equations of electromagnetism with constitutive relations appropriate for time-independent isotropic media yields a system of six coupled first-order partial differential equations referred to as the "EH" system. The name derives from the dependent variables contained therein, namely the electric vector E and the magnetic vector H. Coefficients in the EH system are the three material properties, namely electrical current conductivity, magnetic permeability, and electric permittivity. All of these parameters may vary with 3D spatial position. The inhomogeneous terms in the EH system represent various body sources of electromagnetic waves, and include conduction current sources, magnetic induction sources, and displacement current sources. Conduction current sources, representing current flow in wires, cables, and borehole casings, are the most commonly-used sources in field electromagnetic data acquisition experiments.

In one or more exemplary embodiments, an explicit, time-domain, finite-difference (TDFD) numerical method is used to solve the EH system for the three components of the electric vector E and the three components of the magnetic vector H, as functions of position and time. A three-dimensional gridded representation of the electromagnetic medium parameters, referred to as the "earth model" is required, and may be constructed from available geophysical logs and geological information. A magnitude, direction, and waveform for the current source are also input to the algorithm. The waveform may have a pulse-like shape (as in a Gaussian pulse), or may be a repeating square wave containing both positive and negative polarity, portions, but is not limited to these two particular options. Execution of the numerical algorithm generates electromagnetic responses in the form of time series recorded at receiver locations distributed on or within the gridded earth model. These responses represent the three components of the E or H vector, or their time-derivatives.

Repeated execution of the finite-difference numerical algorithm enables a quantitative estimate of the magnitude and frequency-content of electromagnetic responses (measured on the earth's surface or in nearby boreholes) to be made as important modeling parameters are varied. For example, the depth of current source may be changed from shallow to deep. The current source may be localized at a point, or may be a spatially-extended transmission line, as with an electrically charged borehole casing. The source waveform may be broad-band or narrow-band in spectral content. Finally, changes to the electromagnetic earth model can be made, perhaps to assess the shielding effect of shallow conductive layers. The goal of such a modeling campaign is to assess the sensitivity of recorded electromagnetic data to variations in pertinent parameters. In turn, this information is used to design optimal field data acquisition geometries that have enhanced potential for imaging a proppant-filled fracture at depth.

The electric and magnetic responses are scalable with the input current magnitude. In order to obtain responses above the background electromagnetic noise, a large current on the order of 10 to 100 amps may be required. The impedance of the electric cable to the current contact point and the earth contact resistance will determine the voltage that is required to obtain a desired current. The contact resistance is expected to be small and will not dominate the required voltage. In addition, it may be necessary to sum many repetitions of the measured data to obtain a measurable signal level over the noise level. In the field application and modeling scenarios, a time-domain current source waveform may be used. A typical time-domain waveform consists of an on time of positive current followed by an off time followed by an on time of negative current. In other words, + current, then off, then − current, then off again. The repetition rate to be used would be determined by how long the current has to be on until a steady-state is reached or alternatively how long the energizing current has to be off until the fields have died to nearly zero. In this exemplary method, the measured responses would be analyzed using both the steady-state values and the decaying fields following the current shut-off. The advantage of analyzing the data when the energizing current is zero (decaying fields) is that the primary field contribution (response from the transmitting conductor; i.e., the well casing) has been eliminated and only the earth responses are measured. In addition, the off period of the time domain input signal allows analysis of the direct current electrical fields that may arise from electro-kinetic effects, including but not limited to, flowing fluids and proppant during the fracturing process. Fracture properties (orientation, length, volume, height and asymmetry will be determined through inversion of the measured data and/or a form of holographic reconstruction of that portion of the earth (fracture) that yielded the measured electrical responses or secondary fields. According to certain embodiments, a pre-fracture survey will be prepared to isolate the secondary fields due to the fracture. Those of ordinary skill in the art will recognize that other techniques for analyzing the recorded electromagnetic data, such as use of a pulse-like current source waveform and full waveform inversion of observed electromagnetic data may also be used.

In one or more exemplary embodiments, a frequency domain finite-difference (FDFD) numerical method is used to solve the EH system for the three components of the electric vector E and the three components of the magnetic vector H. The earth model, magnitude, direction, and waveform for the current source can be inputted to the algorithm. Similar to that of the TDFD numerical method, the waveform may have a pulse-like shape (as in a Gaussian pulse), or may be a repeating square wave containing both positive and negative polarity portions, but is not limited to these two particular options. Execution of the numerical algorithm generates electromagnetic responses in the form of frequency series recorded at receiver locations distributed on or within the gridded earth model. These responses represent the three components of the E or H vector; or their frequency-derivatives.

In one or more exemplary embodiments, an induced polarization (IP) effect is used to determine a location of the proppant. The IP effect is present in the time domain where the effect is measured flowing the cessation of the driving electric field. The IP effect is also present in the frequency domain wherein the effect is explained in terms of complex impedance. For time domain measurements the received voltage decay as a function of time is made when the input current is off. The frequency domain measures the phase delay from the input current and the effects of frequency on the received voltage.

The IP effect arises from various causes and different dependencies on the frequency of an impressed electric field. Central to some of the theories is fluid flow in porous media. In a porous medium the earth material is generally slightly negatively charged, thereby attracting positive charged ions in the fluid that makes up the electric double layer (EDL). This leaves the fluid in the pore space somewhat rich in negative charges that now conduct current in a porous medium. The ionic current is the difference in the concentrations of positive and negative ions. The flow of ions takes place due to an impressed electric field, pressure gradient, and/or diffusion where the pore space available for transport is restricted by the EDL. In addition, there are other restrictions for flow (pore throats, other material in the pore space) that can cause charge build up. A metallic ore, which is an electronic conductor, also affects the flow of the ions. Once the forcing electric field is switched off, the charge distribution "wants" to seek a lower energy state, which is the equilibrium condition. Diffusion of charges plays a major role in the quest to obtain equilibrium. In other words, when a surface is immersed or created in an aqueous solution, a discontinuity is formed at the interface where such physicochemical variables as electric potential and electrolyte concentration change significantly from the aqueous phase to another phase. Because of the different chemical potentials between the two phases, charge separation often occurs at the interfacial region. This interfacial region, together with the charged surface, is usually known as the EDL. This EDL, or layer, which can extend as far as 100 nm in a very dilute solution to only a few angstroms in a concentrated solution, plays an important role in electrochemistry, colloid science; and surface chemistry (Devasenathipathy and Santiago, 2003; Kirby and Hasselbrink, 2004; Yang et al., 2004).

Once the conducting proppant has been placed into the fracture(s) and an electric current is supplied to the well casing, the component of the electric field perpendicular to the direction of the fracture will generally be larger than the component parallel to the fracture. The component of the electric field parallel to the fracture will induce ionic conductivity in the fracture fluid that will be impeded due to the ion mobility in the presence of the EDL and the charges induced on the conductive proppant. In addition, there will be electronic current flow via electrically conductive proppant that are in contact with each other. The current flow perpendicular to the fracture will not depend appreciably on the ionic flow but more on electronic conduction via the metallic coated proppant particles. The electronic conduction of electrical current will depend on the volume of the metal present and will rely on proppant particles to be in contact with each other.

If the energizing current is on for a sufficient amount of time so that the movement of charges has reached a steady state in the presence of the applied electric field, then when the current is terminated and the applied electric field goes to zero the charges must redistribute themselves to come to an equilibrium charge distribution. This redistribution does not occur instantaneously, but involves several decay mechanisms, Membrane IP effects can occur along with the electrode polarization effect. The conductive coatings present at or on the proppant surface can produce a significant IP response through the chargeability that is related to the surface impedance term. The surface impedance term will have some time (or frequency) dependent decay characteristic. This IP response from the conductive proppant particles will depend upon the total surface coated area of these proppant particles. For example, for a 1 micron thick metallic coating on a proppant particle substrate having a diameter 700 microns, the volume of metallic coating is approximately $15 \times 10^{-13}$ m$^3$ and the surface are per proppant particle is $1.54 \times 10^{-6}$ m$^2$. A 75% packing factor, for example, would mean $4.14 \times 10^9$ proppant particles per unit volume, where the total volume of metal is 0.0062 m$^3$ per cubic meter while the total surface area is 6380 m$^1$ per cubic meter. This calculation shows that the IP effect due to the metallic coated proppant particles has the potential to be greater than the enhanced conductivity effect of the metallic coated proppant particles.

Another EM response that impacts IP measurements is the inductive response of the earth. The inductive response arises from the Faraday/Lentz law which produces eddy currents in conductive media. The response is based upon the time-rate-of-change of the magnetic field; if the magnetic field is increasing, eddy currents are generated in the conductor (earth) to create a magnetic field opposite to the increasing magnetic field, and if the magnetic field is decreasing eddy currents are generated in the conductor to create a magnetic field opposite that of the decreasing magnetic field. The result of this is to produce a response much like the IP response; i.e., after a turn on of a primary magnetic field (turning on the current), the response takes time to achieve saturation and following the turn off of the primary magnetic field (turning off the current) the response slowly decays to zero. Along with the surrounding conducting earth, the conducting fracture (fluid and proppant) will generate an inductive response in addition to the IP response discussed above. Due to the coupling of electric and magnetic field through Maxwell's equations, the magnetic induction manifests itself in the electric field as well. The inductive and IP effects are additive. These two responses can be separated in the magnetic field due to their different frequency responses.

Also, the finite-difference solutions to Maxwell's equations, FDEM, includes the inductive responses, but not the IP responses. In one or more exemplary embodiments; the IP effects can be included into the FDEM algorithm by treating the IP effect as a time dependent source term. If the IP effect is treated as a time dependent source term, then the IP effect can be much larger than the pure conductive response.

A field data acquisition experiment was conducted to test the transmission line representation of a well casing current source. The calculated electric field and the measured electric field are in good agreement. This test demonstrates that the transmission line current source implementation in the 3D finite-difference electromagnetic code gives accurate results. The agreement, of course, depends upon an accurate model describing the electromagnetic properties of the earth. In this field data acquisition experiment, common electrical logs were used to characterize the electrical properties of the earth surrounding the test well bore and to construct the earth model.

The following examples are included to demonstrate illustrative embodiments of the present invention. It will be appreciated by those of ordinary skill in the art that the techniques disclosed in these examples are merely illustrative and are not limiting. Indeed, those of ordinary skill in the art should, in light of the present disclosure, appreciate that many changes can be made in the specific embodiments that are disclosed, and still obtain a like or similar result without departing from the spirit and scope of the invention.

Example 1

Figure 11:
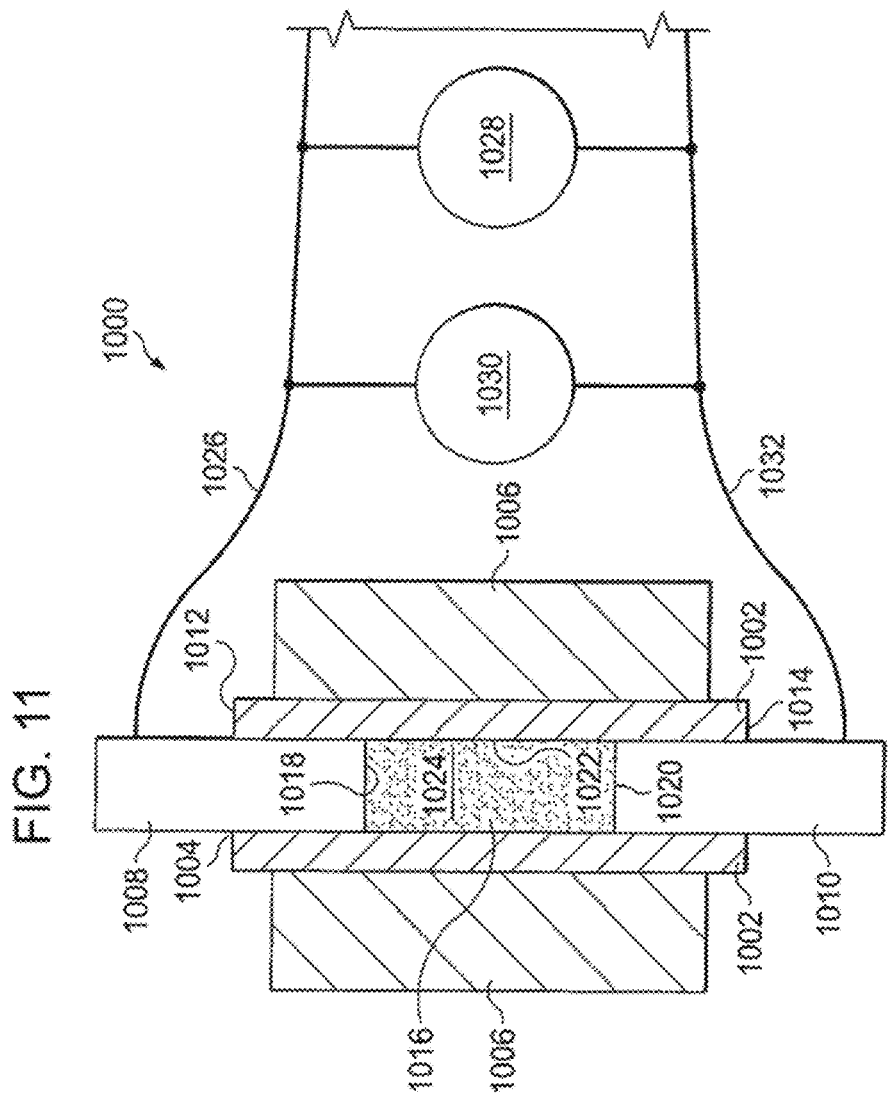
FIG. 11 is schematic illustration of a test system for measuring proppant electrical resistance.

The electrical conductivity of various proppant samples was measured using the test device shown in FIG. 11. As shown in FIG. 11, the test system 1000 included an insulating boron nitride die 1002, having an inside diameter of 0.5 inches and an outside diameter of 1.0 inches, disposed in a bore 1004 in a steel die 1006 in which the bore 1004 had an inside diameter of 1.0 inches, Upper and lower steel plungers 1008 and 1010 having an outside diameter of 0.5 inches were inserted in the upper and lower ends 1012, 1014, respectively, of the insulating boron nitride die 1002 such that a chamber 1016 is formed between the leading end 1018 of the upper plunger 208, the leading end 1020 of the lower plunger 1010 and the inner wall 1022 of the boron nitride sleeve 1002. Upper plunger 1008 was removed from the insulating boron nitride die 1002 and proppant was loaded into the chamber 1016 until the proppant bed 1024 reached a height of about 1 to 2 cm above the leading end 1020 of the lower plunger 1010. The upper plunger 1008 was then reinstalled in the insulating boron nitride die 1002 until the leading end 1018 of the upper plunger 1008 engaged the proppant 1024. A copper wire 1026 was connected to the upper plunger 1008 and one pole of each of a current source 1028 and a voltmeter 1030. A second copper wire was connected to the lower plunger 1010 and the other pole of each of the current source 1028 and the voltmeter 1030. The current source may be any suitable DC current source well known to those of ordinary skill in the art such as a Keithley 237 High Voltage Source Measurement Unit in the DC current source mode and the voltmeter may be any suitable voltmeter well known to those of ordinary skill in the art such as a Fluke 175 True RMS Multimeter which may be used in the DC mV mode for certain samples and in the ohmmeter mode for higher resistance samples.

The current source was powered on and the resistance of the test system 1000 with the proppant bed 1024 in the chamber 1016 was then determined. The resistance of the proppant 1024 was then measured with the Multimeter as a function of pressure using the upper plunger 1008 and lower plunger 1010 both as electrodes and to apply pressure to the proppant bed 1024. Specifically, R=V/I–the resistance of the system with the plungers touching is subtracted from the values measured with the proppant bed 1024 in the chamber 1016 and the resistivity, $p=R*A/t$ where A is the area occupied by the proppant bed 1024 and t is the thickness of the proppant bed 1024 between the upper plunger 1008 and the lower plunger 1010.

The results were as follows:

Electrical measurements of base proppants without the addition of any conductive material were conducted at 100 V DC on samples that were 50 volume % proppant in wax that were pressed into discs nominally 1 inch in diameter and approximately 2 mm thick. Using these values to calculate the resistivity and using the measured resistivity for pure wax, the values below were extrapolated by plotting log (resistivity) vs. volume fraction proppant and extrapolating to a volume fraction of one:

CARBOPROP 40/70: $2 \times 10^{12}$ Ohm-cm
CARBOPROP 20/40: $0.6 \times 10^{12}$ Ohm-cm
CARBOHYDROPROP: $1.8 \times 10^{12}$ Ohm-cm
CARBOECONOPROP: $9 \times 10^{12}$ Ohm-cm It should be noted that the resistivities of the samples measured above are very high and not suitable for detection in the present invention.

Example 2

Figure 12:
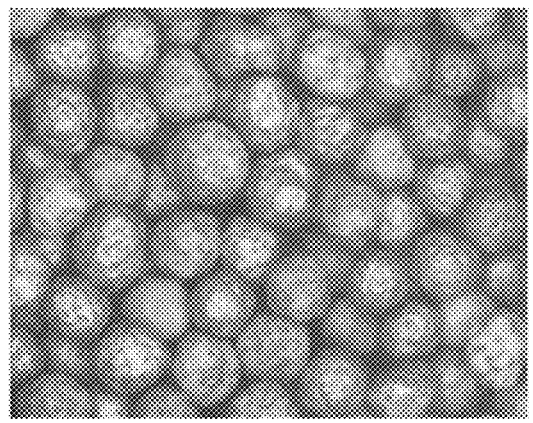
FIG. 12 shows a sample of 20/40 Mesh CARBOECONOPROP® non-uniformly coated with a nickel alloy coating having an average thickness of about 192 nm.
Figure 13:
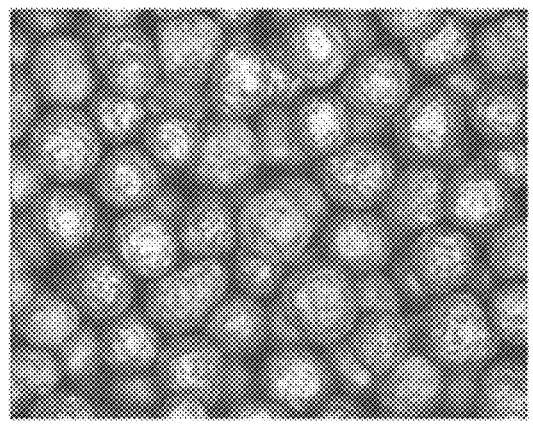
FIG. 13 shows a sample of 20/40 Mesh CARBOECONOPROP non-uniformly coated with a nickel alloy coating having an average thickness of about 390 nm.
Figure 14:
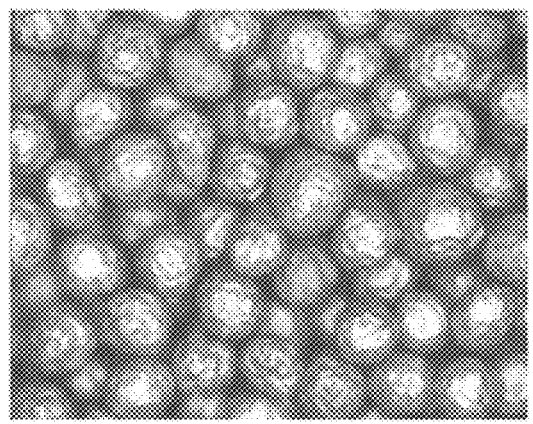
FIG. 14 shows a sample of 20/40 Mesh CARBOECONOPROP non-uniformly coated with a nickel alloy coating having an average thickness of about 670 nm.
Figure 15:
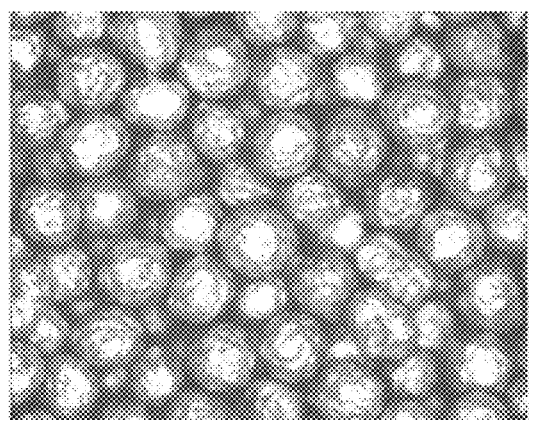
FIG. 15 shows a sample of 20/40 Mesh CARBOECONOPROP uniformly coated with a nickel alloy coating having an average thickness of about 780 nm.
Figure 16:
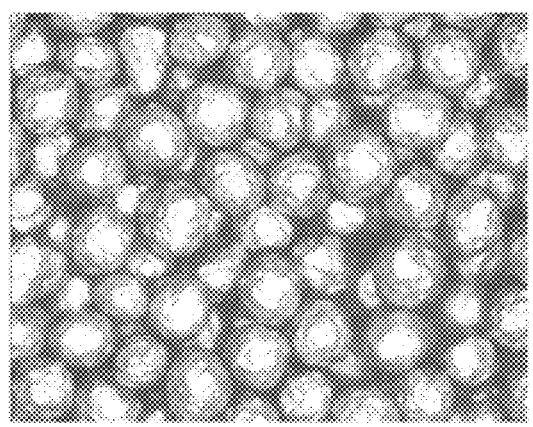
FIG. 16 shows a sample of 20/40 Mesh CARBOECONOPROP uniformly coated with a nickel alloy coating having an average thickness of about 1,080 nm.

Three batches of 20/40 mesh size conventional ceramic proppant (EconoProp), commercially available as CARBO-ECONOPROP® from CARBO Ceramics Inc., were separately non-uniformly coated with a nickel-phosphorous alloy to provide non-uniformly coated conventional proppant with different coating thicknesses of 192 nm, 390 nm, and 670 nm as shown in FIGS. 12-14, respectively. Two more batches of EconoProp were separately, uniformly coated with the nickel-phosphorous alloy to provide uniformly coated proppant with different coating thicknesses of 780 nm and 1,080 nm as shown in FIGS. 15 and 16, respectively. Each of the batches shown in FIGS. 12-16 were coated by placing the uncoated EconoProp into an electroless plating bath solution comprising a nickel and phosphorous solution.

Figure 17:
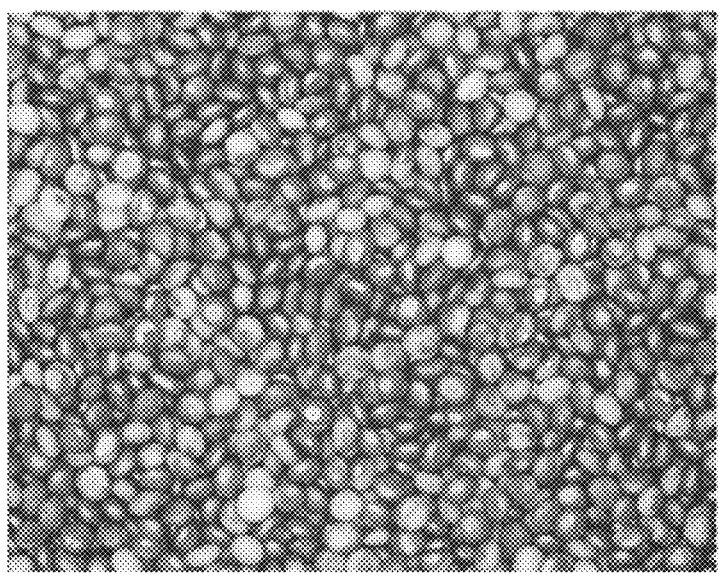
FIG. 17 shows a sample at 7× magnification of 25 Mesh KRYPTOSPHERE® HD non-uniformly coated with a nickel alloy coating having an average thickness of about 200 nm.
Figure 18:
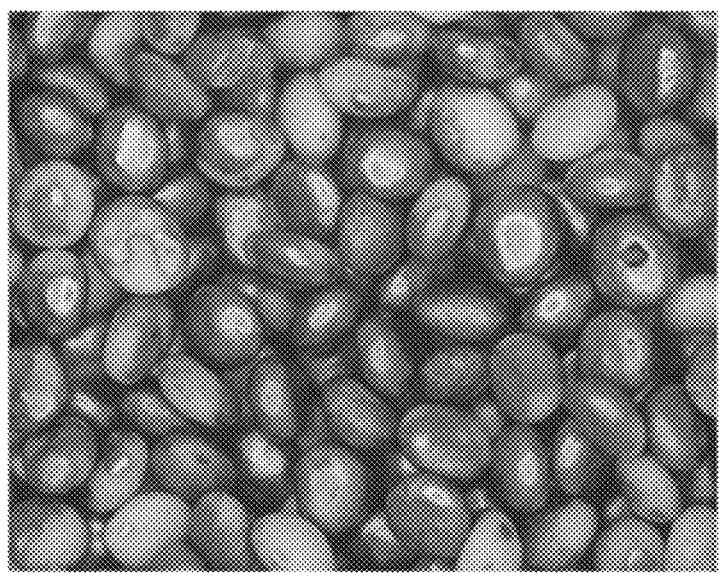
FIG. 18 shows a sample at 20× magnification of 2.5 Mesh KRYPTOSPHERE HD non-uniformly coated with a nickel alloy coating having an average thickness of about 200 nm.
Figure 19:
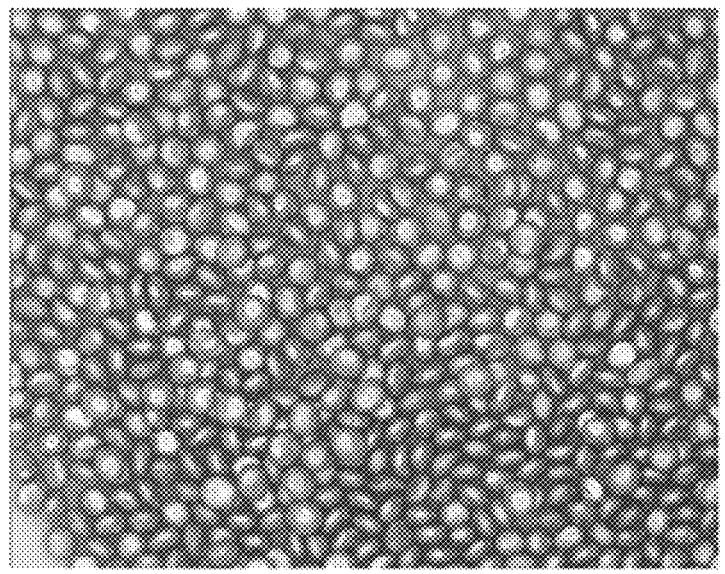
FIG. 19 shows a sample at 7× magnification of 25 Mesh KRYPTOSPFIERE HE uniformly coated with a nickel alloy coating having an average thickness of about 500 nm.
Figure 20:
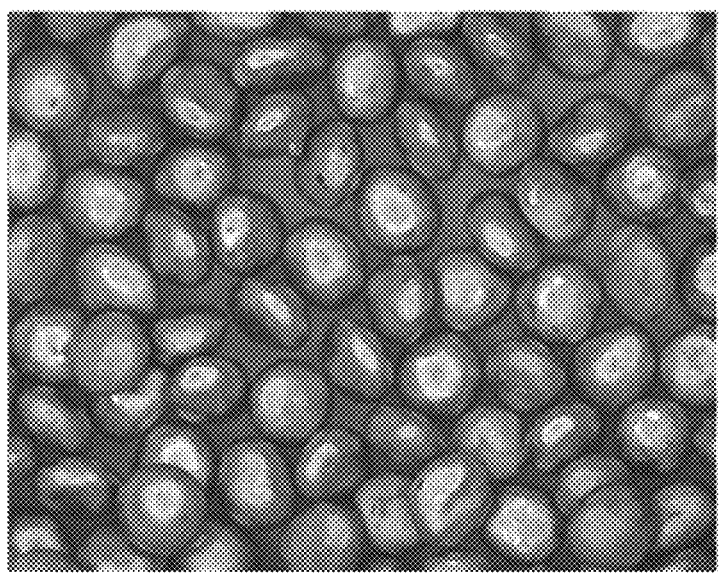
FIG. 20 shows a sample at 20× magnification of 25 Mesh KRYPTOSPHERE HD uniformly coated with a nickel alloy coating having an average thickness of about 500 nm.

A batch of 25 mesh size drip cast proppant (KS-H 25), commercially available as KRYPTOSPHERE® HD from CARBO Ceramics Inc., was non-uniformly coated with the nickel-phosphorous alloy to provide non-uniformly coated drip cast proppant shown in FIGS. 17 and 18 at 7× and 20× magnification, respectively. The batch shown in FIGS. 17-18 was coated by placing the KS-H 25 into an electroless plating bath solution comprising a nickel and phosphorous solution for 25 minutes to provide an approximate coating thickness of 200 nm. Another batch of KS-H 25 was uniformly coated with the nickel-phosphorous alloy to provide uniformly coated proppant shown in FIGS. 19 and 20 at 7× and 20× magnification, respectively. The batch shown in FIGS. 19-20 was coated by placing the KS-H 25 into an electroless plating bath solution comprising a nickel and phosphorous solution for 45 minutes to provide an approximate coating thickness of 500 nm.

The electrical conductivity of each batch was independently tested using the test device shown in FIG. 11. The results and respective coating thicknesses for each batch are shown in Table 1 below.

TABLE 1

| Ceramic Substrate | Surface Area ($m^2/g$) | Approximate Nickel Thickness (nm) | Approximate Ni Coating Coverage (%) | Resistivity (Ohms) |
|---|---|---|---|---|
| 20/40 EconoProp | .0238 | 192 | 45 | 5 |
| 20/40 EconoProp | .0238 | 390 | 75 | 1.9 |
| 20/40 EconoProp | .0238 | 670 | 90 | 0.9 |
| 20/40 EconoProp | .0238 | 780 | 100 | 0.8 |
| 20/40 EconoProp | .0238 | 1,080 | 100 | 0.6 |

TABLE 1-continued

| Ceramic Substrate | Surface Area (m$^2$/g) | Approximate Nickel Thickness (nm) | Approximate Ni Coating Coverage (%) | Resistivity (Ohms) |
|---|---|---|---|---|
| KS-H 25 | .0156 | 200 | 50 | 1.1 |
| KS-H 25 | .0156 | 500 | 100 | 0.3 |

For successful EM detection it can be desirable for the proppant to have a resistivity of about 1 ohm or less. Surprisingly, the incomplete coverage of the non-uniform coatings was able to provide the target 1 ohm resistivity with both the EconoProp and the KS-H. Also surprising, was the lower required coating thickness for the drip cast KS-14 batches when compared to the conventional EconoProp batches. These results suggest that the features of the drip cast proppant, such as smoothness and shape, allows for low resistivity with non-uniform coatings having low coating thicknesses.

Example 3

For this example, a first batch of 40/70 mesh size EconoProp coated with nickel and having a resitivity of 0.3 Ohm, a second batch of 40/70 mesh size EconoProp coated with nickel and having a resitivity of 0.7 Ohm, and a third batch of 40/70 mesh size EconoProp coated with nickel and having a resitivity of 0.3 Ohm admixed with 40/70 bare sand on a 1:1 weight ratio were separately tested for conductivity at varied pressures.

The electrical conductivity of each batch 1-3 was independently tested using the test device shown in FIG. 11. The results and respective coating thicknesses for each batch are shown in Table 1 below.

TABLE 1

| Batch | Compressive Stress (psi) | Conductivity (S/m) |
|---|---|---|
| 0.3 Ohm 40/70 CEP (Batch 1) | 509.42 | 2596.71 |
|  | 636.78 | 2702.82 |
|  | 764.14 | 2815.47 |
|  | 891.49 | 2935.27 |
|  | 1018.85 | 3062.92 |
|  | 1273.56 | 3199.23 |
|  | 1528.27 | 3421.94 |
|  | 1782.99 | 3584.17 |
|  | 2037.7 | 3669.87 |
|  | 2292.41 | 3758.87 |
|  | 2547.12 | 3851.36 |
| 0.7 Ohm 40/70 CEP (Batch 2) | 509.42 | 1069 |
|  | 636.78 | 1156.38 |
|  | 764.14 | 1251.63 |
|  | 891.49 | 1334.24 |
|  | 1018.85 | 1377.9 |
|  | 1273.56 | 1519.48 |
|  | 1528.27 | 1596.91 |
|  | 1782.99 | 1707.99 |
|  | 2037.7 | 1767.24 |
|  | 2292.41 | 1829.18 |
|  | 2547.12 | 1894 |
| 1:1 mixture of 40/70 sand and 0.3 Ohm 40/70 CEP (Batch 3) | 509.42 | 38.95 |
|  | 636.78 | 43.02 |
|  | 764.14 | 47.12 |
|  | 891.49 | 51.26 |
|  | 1018.85 | 55.43 |
|  | 1273.56 | 63.88 |
|  | 1528.27 | 72.46 |
|  | 1782.99 | 76.81 |
|  | 2037.7 | 81.2 |
|  | 2292.41 | 90.08 |
|  | 2547.12 | 99.12 |

For successful EM detection it can be desirable for the proppant to have an electrical conductivity of at least 10 S/m. The 1:1 mixture of electrically conductive proppant (0.3 Ohm 40/70 CEP) and non-electrically conductive bare sand was able to provide and surpass the target 10 S/m conductivity, suggesting that a mixture of electrically conductive and non-electrically conductive proppant can form a proppant pack having an electrical conductivity suitable for detection using the methods disclosed herein.

When used as a proppant, the particles described herein may be handled in the same manner as ordinary proppants. For example, the particles may be delivered to the well site in bags or in bulk form along with the other materials used in fracturing treatment. Conventional equipment and techniques may be used to place the particles in the formation as a proppant. For example, the particles are mixed with a fracture fluid, which is then injected into a fracture in the formation.

In an exemplary method of fracturing a subterranean formation, a hydraulic fluid is injected into the formation at a rate and pressure sufficient to open a fracture therein, and a fluid containing sintered, substantially round and spherical particles prepared from a slurry as described herein and having one or more of the properties as described herein is injected into the fracture to prop the fracture in an open condition.

The foregoing description and embodiments are intended to illustrate the invention without limiting it thereby. It will be understood that various modifications can be made in the invention without departing from the spirit or scope thereof

What is claimed is:
1. An electrically conductive proppant pack, comprising:
a plurality of particles having less than about 30% crush at 4,000 psi and a specific gravity of about 4 g/cm$^3$ or less; and
a non-uniform coating of an electrically conductive material having a thickness of at least about 10 nm disposed on an outer surface of one or more of the plurality of particles, wherein the electrically conductive proppant pack has an electrical conductivity of at least 10 S/m.
2. The electrically conductive proppant pack of claim 1, wherein the non-uniform coating of the electrically conductive material has a thickness of from about 100 nm to about 5,000 nm.
3. The electrically conductive proppant pack of claim 1, wherein the electrically conductive material is selected from the group consisting of aluminum, copper, nickel, and phosphorous and any alloy or mixture thereof.
4. The electrically conductive proppant pack of claim 1, wherein the electrically conductive material is selected from the group consisting of pyrolytic carbon, carbon black, graphite, coke breeze, carbon fiber; and carbon nanotubes and combination thereof.
5. The electrically conductive proppant pack of claim 1, wherein the electrically conductive material is in the form of particles; nanoparticles, metal clusters, metal flake, metal shot; metal powder, metalloids, metal nanoparticles, quantum dots, carbon nanotubes or buckminsterfullerenes.

6. The electrically conductive proppant pack of claim 1, wherein one or more of the plurality of particles have less than 95% of their respective outer surface covered with the electrically conductive material.

7. The electrically conductive proppant pack of claim 1, wherein each particle of the plurality of particles has a size from about 100 to about 10 mesh.

8. The electrically conductive proppant pack of claim 1, wherein each particle of the plurality of particles is selected from the group consisting of ceramic proppant, sand, plastic beads and glass beads.

9. The electrically conductive proppant pack of claim 1, wherein each particle of the plurality of particles has an alumina content of at least about 30 wt % on a calcined basis and a crush strength at 10,000 psi of from about 5% to about 8.5%.

10. An electrically conductive proppant pack, comprising:
a plurality of proppant particles, at least a first portion of said proppant particles comprising a coating containing an electrically conductive material having a thickness of at least 10 nm on an outer surface of each said proppant particle of the first portion, wherein the electrically conductive material is in the form of electrically conductive particles, wherein the proppant particles have an apparent specific gravity of about 4 g/cm$^3$ or less, and wherein the proppant pack has an electrical conductivity of at least 10 S/m.

11. The proppant pack of claim 10, wherein the electrically conductive particles are pyrolytic carbon, carbon black, graphite, coke breeze, carbon fiber, carbon nanotubes, metal clusters, metal flake, metal shot, metal powder, metalloids, metal nanoparticles, quantum dots, carbon nanotubes, or buckminsterfullerenes or combinations thereof.

12. The proppant pack of claim 11, wherein less than 100% of the outer surface of each said particle comprising the coating is coated with the electrically conductive material.

13. The proppant pack of claim 10, wherein a second portion of said proppant particles comprises a uniform coating of a second electrically conductive material.

14. The proppant pack of claim 13, wherein the second electrically conductive material comprises nickel.

15. The proppant pack of claim 14, wherein the second electrically conductive material is an alloy of nickel and copper.

16. A method of fracturing a subterranean formation, comprising:
injecting a hydraulic fluid into a wellbore extending into the subterranean formation at a rate and pressure sufficient to open a fracture therein;
injecting into the fracture a fluid containing a plurality of proppant particles and a plurality of electrically conductive particles; and
forming a proppant pack from the plurality of proppant particles and the plurality of electrically conductive particles inside the fracture, the proppant pack comprising an electrical conductivity of at least 10 S/m and having a long-term permeability greater than 10 darcies at a stress of 7,500 psi and a temperature of 250° F., as measured in accord with ISO 13503-5.

17. The method of claim 16, wherein the electrically conductive particles are pyrolytic carbon, carbon black, graphite, coke breeze, carbon fiber, carbon nanotubes, metal clusters, metal flake, metal shot, metal powder, metalloids, metal nanoparticles, quantum dots, carbon nanotubes, or buckminsterfullerenes or combinations thereof.

18. The method of claim 17, further comprising:
electrically energizing the earth at or near the fracture; and
measuring one or more electric and/or magnetic field responses at a surface of the earth or in an adjacent wellbore.

19. The method of claim 18, further comprising measuring an induced polarization effect to determine a location of the plurality of proppant particles.

20. The method of claim 19, further comprising measuring an inductive response of the earth to determine the location of the plurality of proppant particles.

* * * * *